(12) United States Patent
Haratsch

(10) Patent No.: US 7,702,991 B2
(45) Date of Patent: *Apr. 20, 2010

(54) METHOD AND APPARATUS FOR REDUCED-STATE VITERBI DETECTION IN A READ CHANNEL OF A MAGNETIC RECORDING SYSTEM

(75) Inventor: Erich Franz Haratsch, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/691,847

(22) Filed: Mar. 27, 2007

(65) Prior Publication Data

US 2007/0189424 A1 Aug. 16, 2007

Related U.S. Application Data

(60) Continuation of application No. 10/853,090, filed on May 25, 2004, now abandoned, and a continuation-in-part of application No. 11/234,446, filed on Sep. 26, 2005, which is a division of application No. 09/834,668, filed on Apr. 13, 2001, now Pat. No. 7,000,175.

(51) Int. Cl.
*H03M 13/03* (2006.01)

(52) U.S. Cl. ............ 714/796; 714/795; 360/39; 360/65; 375/340; 375/341; 375/262; 375/265

(58) Field of Classification Search .......... 375/340, 375/341, 345, 229, 262, 265, 348; 714/794–796; 360/31, 46, 65, 67

See application file for complete search history.

(56) References Cited

U.S. PATENT DOCUMENTS

| 4,614,933 | A | * | 9/1986 | Yamashita et al. | ........... 341/51 |
| 4,669,084 | A | * | 5/1987 | Hartman et al. | ............ 714/786 |
| 5,136,593 | A | | 8/1992 | Moon et al. | |
| 5,220,570 | A | * | 6/1993 | Lou et al. | ............ 714/791 |
| 5,291,499 | A | * | 3/1994 | Behrens et al. | ............ 714/796 |
| 5,291,523 | A | * | 3/1994 | Bergmans et al. | ........... 375/232 |
| 5,422,760 | A | * | 6/1995 | Abbott et al. | ............ 360/46 |
| 5,844,946 | A | * | 12/1998 | Nagayasu | ............ 375/341 |
| 5,870,433 | A | | 2/1999 | Huber et al. | |

(Continued)

OTHER PUBLICATIONS

Keshab K. Parhi, "Pipelining in Algorithms with Quantizer Loops," IEEE Transactions on Circuits and Systems, vol. 38, No. 7, 745-754 (Jul. 1991).

(Continued)

*Primary Examiner*—Dismery E Mercedes
(74) *Attorney, Agent, or Firm*—Ryan, Mason & Lewis, LLP

(57) ABSTRACT

A method and apparatus are disclosed for improving the maximum data rate of reduced-state Viterbi detectors with local feedback in magnetic recording systems. A read channel signal is processed in a magnetic recording device by precomputing branch metrics, intersymbol interference estimates or intersymbol interference-free signal estimates for speculative sequences of one or more channel symbols; selecting one of the precomputed values based on at least one decision from at least one corresponding state; and selecting a path having a best path metric for a given state.

20 Claims, 14 Drawing Sheets

U.S. PATENT DOCUMENTS

| | | | |
|---|---|---|---|
| 5,881,106 A * | 3/1999 | Cartier | 375/262 |
| 5,889,823 A * | 3/1999 | Agazzi et al. | 375/341 |
| 5,910,968 A | 6/1999 | Chouly et al. | |
| 5,970,104 A * | 10/1999 | Zhong et al. | 375/341 |
| 6,035,006 A | 3/2000 | Matui | |
| 6,070,263 A * | 5/2000 | Tsui et al. | 714/795 |
| 6,088,404 A | 7/2000 | Jekal | |
| 6,104,766 A * | 8/2000 | Coker et al. | 375/341 |
| 6,201,831 B1 | 3/2001 | Agazzi et al. | |
| 6,356,586 B1 * | 3/2002 | Krishnamoorthy et al. | 375/233 |
| 6,374,387 B1 * | 4/2002 | van den Berghe | 714/790 |
| 6,396,254 B1 * | 5/2002 | Feyh et al. | 324/76.19 |
| 6,415,415 B1 * | 7/2002 | Karabed | 714/795 |
| 6,467,064 B1 * | 10/2002 | Anan et al. | 714/795 |
| 6,654,929 B1 * | 11/2003 | Kamada | 714/795 |
| 6,690,739 B1 * | 2/2004 | Mui | 375/265 |
| 6,701,483 B1 * | 3/2004 | Heegard et al. | 714/791 |
| 6,757,864 B1 * | 6/2004 | Hansquine | 714/794 |
| 6,788,482 B2 * | 9/2004 | Bliss et al. | 360/46 |
| 6,954,841 B2 * | 10/2005 | Moreno et al. | 712/9 |
| 6,999,521 B1 * | 2/2006 | Azadet et al. | 375/262 |
| 7,000,175 B2 * | 2/2006 | Azadet et al. | 714/794 |
| 7,277,506 B1 * | 10/2007 | Pope et al. | 375/341 |
| 7,363,576 B2 * | 4/2008 | Azadet et al. | 714/794 |
| 7,380,199 B2 * | 5/2008 | Haratsch | 714/796 |
| 7,487,432 B2 * | 2/2009 | Ashley et al. | 714/796 |
| 2002/0073377 A1 * | 6/2002 | Patapoutian | 714/788 |
| 2002/0083396 A1 * | 6/2002 | Azadet et al. | 714/796 |
| 2002/1008339 * | 6/2002 | Azadet et al. | 714/796 |
| 2003/0120993 A1 * | 6/2003 | Cox | 714/786 |
| 2003/0123585 A1 * | 7/2003 | Yen | 375/350 |
| 2004/0032683 A1 * | 2/2004 | Ashley et al. | 360/46 |
| 2004/0037373 A1 * | 2/2004 | Ashley et al. | 375/341 |
| 2004/0133843 A1 * | 7/2004 | Yamakawa | 714/794 |
| 2005/0060633 A1 * | 3/2005 | Parhi et al. | 714/795 |
| 2005/0105658 A1 * | 5/2005 | Haratsch | 375/348 |
| 2005/0264906 A1 * | 12/2005 | Haratsch | 360/39 |
| 2005/0268211 A1 * | 12/2005 | Haratsch | 714/796 |

OTHER PUBLICATIONS

Bednarz et al., "Design, Performance, and Extensions of the RAM-DFE Architecture," IEEE Transactions on Magnetics, vol. 31, No. 2, 1196-1201 (Mar. 1995).

U.S. Appl. No. 09/471,920, filed Dec. 23, 1999, Azadet et al.

U.S. Appl. No. 09/834,668, filed Apr. 13, 2001, Azadet et al.

Azadet, K., "Gigabit Ethernet Over Unshielded Twisted Pair Cables," Bell Laboratories, Lucent Technologies, Holmdel, NJ, USA.

Bednarz et al., "Design Performance, and Extensions of the RAM-DFE Architecture," IEEE Transactions on Magnetics, vol. 31, No. 2, pp. 1196-1201 (Mar. 1995).

Black et al., "A 140-Mb/s, 32-State, Radix-4 Viterbi Decoder," IEEE Journal of Solid-State Circuits, vol. 27, No. 12 (Dec. 1992).

Chevillat et al., "Decoding of Trellis-Encoded Signals in the Presence of Intersymbol Interference and Noise," IEEE Transactions on Communications, vol. 37, No. 7 (Jul. 1989).

Cypher et al., "Generalized Trace-Back Techniques for Survivor Memory Management in the Viterbi Algorithm," Journal of VLSI Signal Processing, 5, pp. 85-94 (1993).

Fettweis et al., "High-Speed Parallel Viterbi Decoding: Algorithm and VLSI-Architecture," IEEE Communications Magazine (May 1991).

Haratsch, E.F., "High-Speed VLSI Implementation of Reduced Complexity Sequence Estimation Algorithms with Applications to Gigabit Ethernet 1000Base-T," Bell Laboratories, Lucent Technologies, Holmdel, NJ, USA.

Haratsch, E.F., "Viterbi Detector Architectures for Magnetic Recording," VLSI Technology, Systems, and Applications, 2003 International Symposium, pp. 239-242 (Oct. 6-8, 3003).

Parhi, K.K., "Pipelining in Algorithms with Quantizer Loops," IEEE Transactions on Circuits and Systems, vol. 38, No. 7, pp. 745-754 (Jul. 1991).

Rizos et al., "Reduced-Complexity Sequence Detection Approaches for PR-Shaped, Coded Linear Modulations," IEEE Global Telecommunications Conference, vol. 1, pp. 342-346 (Nov. 1997).

* cited by examiner

METHOD AND APPARATUS FOR REDUCED-STATE VITERBI DETECTION IN A READ CHANNEL OF A MAGNETIC RECORDING SYSTEM

CROSS-REFERENCE TO RELATED APPLICATIONS

This application is a continuation application of U.S. patent application Ser. No. 10/853,090, filed May 25, 2004 now abandoned and a continuation-in-part of pending U.S. application Ser. No. 11/234,446, filed Sep. 26, 2005, which is a divisional of U.S. application Ser. No. 09/834,668, filed Apr. 13, 2001, now U.S. Pat. No. 7,000,175, each incorporated by reference herein.

FIELD OF THE INVENTION

The present invention relates generally to equalization, detection and decoding techniques and, more particularly, to sequence estimation techniques with reduced complexity.

BACKGROUND OF THE INVENTION

A magnetic recording read channel converts an analog read channel into an estimate of the user data recorded on a magnetic medium. Read heads and magnetic media introduce noise and other distortions into the read signal. As the information densities in magnetic recording increase, the intersymbol interference (ISI) becomes more severe as well, (i.e., the channel impulse response becomes longer). In read channel chips, a Viterbi detector is typically used to detect the read data bits in the presence of intersymbol interference and noise. When the channel impulse response is long, however, the hardware complexity associated with the Viterbi detector becomes prohibitively large, as the number of states considered by the Viterbi detector grows exponentially with the length of the channel impulse response. A number of techniques have been proposed or suggested for reducing the complexity of Viterbi detectors.

For example, the hardware complexity of the Viterbi detector can be reduced by using a reduced-state trellis that considers only a shortened impulse response, and canceling intersymbol interference due to the tail of the impulse response for each state by using past survivor symbols as local feedback. See, e.g., J. W. M. Bergmans, "Digital Baseband Transmission and Recording," Kluwer Academic Publishers, 326 (1996) or U.S. Pat. No. 6,690,754, issued to Haratsch et al., entitled "Method and Apparatus for Reducing the Computational Complexity and Relaxing the Critical Path of Reduced-State Sequence Estimation (RSSE) Techniques," incorporated by reference herein.

The error rate performance of reduced-state Viterbi detectors with local feedback can approach the performance of full-state Viterbi detectors without local feedback that implement maximum likelihood sequence estimation (MLSE). The maximum achievable data rate of a Viterbi detector implementation with local feedback, however, is considerably lower compared to a Viterbi detector implementation without local feedback, as significantly more operations have to be performed within one clock period. A need therefore exists for a method and apparatus for performing reduced-state Viterbi detection with local feedback at the high data rates that are required by evolving high-end storage applications.

SUMMARY OF THE INVENTION

Generally, a method and apparatus are disclosed for improving the maximum data rate of reduced-state Viterbi detectors with local feedback in magnetic recording systems. The maximum data rate that may be achieved by the disclosed reduced-state Viterbi detectors is improved by precomputing a number of candidate branch metrics and performing pipelined selection of one of the precomputed values. Precomputing the branch metrics for possible symbol combinations in the channel memory makes it possible to shorten the critical path. In an alternative embodiment, intersymbol interference estimates or inter symbol interference-free signal estimates are precomputed, and branch metric are computed based on the selected precomputed values.

A read channel signal is processed in a magnetic recording device by precomputing branch metrics, intersymbol interference estimates or intersymbol interference-free signal estimates for speculative sequences of one or more channel symbols; selecting one of the precomputed values based on at least one decision from at least one corresponding state; and selecting a path having a best path metric for a given state.

A more complete understanding of the present invention, as well as further features and advantages of the present invention, will be obtained by reference to the following detailed description and drawings.

DETAILED DESCRIPTION

The present invention increases the maximum data rate that may be achieved by reduced-state Viterbi detectors. According to one aspect of the invention, branch metrics, ISI-free signal estimates or ISI estimates are precomputed, and the correct values are selected based on survivor symbols or ACS decisions. In this manner, the computations of ISI estimates, ISI-free signal estimates or branch metrics are removed from the critical path. According to another aspect of the invention, branch metrics, ISI-free signal estimates or ISI estimates can be selected in a pipelined fashion using a multiplexer network structure that corresponds to the structure of the trellis considered by the detector.

For a detailed discussion of reduced-state Viterbi detection with local feedback, which is also known as Reduced-State Sequence Estimation (RSSE), (Delayed) Decision-Feedback Sequence Estimation (DFSE), and Parallel Decision-Feedback Equalization (PDFE), see, for example, U.S. Pat. No. 6,690,754 to Haratsch et al., entitled "Method and Apparatus for Reducing the Computational Complexity and Relaxing the Critical Path of Reduced-State Sequence Estimation (RSSE) Techniques," incorporated by reference herein, and the references cited therein. See also, Lee and Messerschmidt, "Digital Communication," Kluwer Academic Publishers, $2^{nd}$ ed. (1994).

Figure 1:
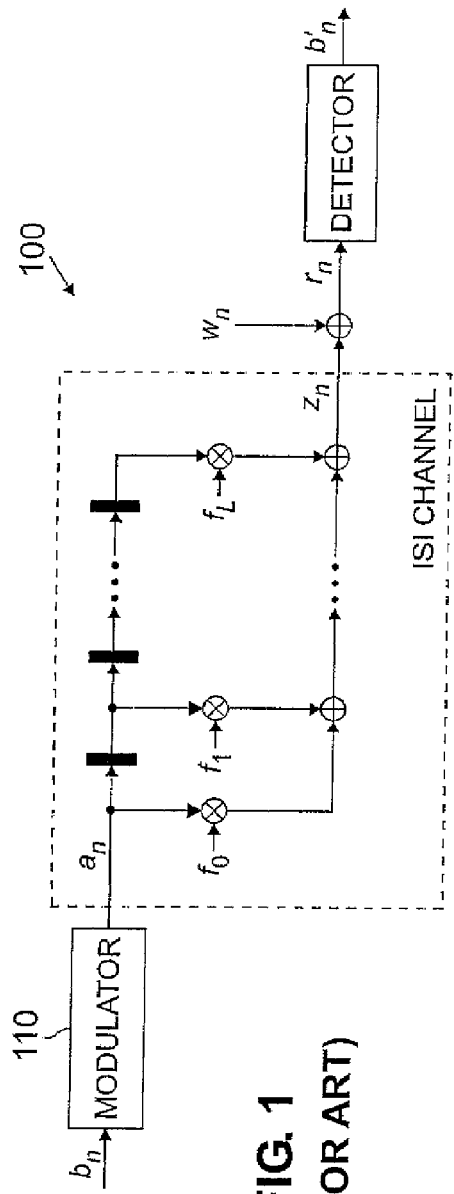
FIG. 1 is a schematic block diagram of a conventional system model for a baseband communications channel with ISI and additive noise.

FIG. 1 is a schematic block diagram of a conventional system model for a baseband communications channel 100 with ISI and additive noise. While the exemplary embodiment is discussed in the context of baseband communications, the techniques discussed herein can also be applied to passband communications systems, as would be apparent to a person of ordinary skill in the art. Further, while it is assumed that trellis-coded modulation (TCM) is not employed for ease of illustration, the disclosed techniques generalize to communication systems using TCM or other modulation schemes.

The modulator 110 maps an information symbol $b_n$ into a channel symbol $a_n$. For ease of illustration, it is assumed that the number of information bits per information symbol is one. In other words, the information symbol $b_n$ is equivalent to a single information bit $b_n$. The modulator 110 maps an information symbol $b_n$ to a two-level channel symbol $a_n$ according to following rule:

$$a_n = \begin{cases} -1, & b_n = 0 \\ 1, & b_n = 1 \end{cases} \quad (1)$$

The techniques discussed herein can easily be applied to other modulation schemes and more than two signal levels. For a discussion of reduced-state Viterbi detection for an exemplary modulation scheme with five signal levels, see, U.S. patent application Ser. No. 09/471,920, entitled, "Method and Apparatus for Shortening the Critical Path of Reduced Complexity Sequence Estimation Techniques," incorporated by reference herein.

The ISI channel 100 is modeled as an FIR filter, and the channel output at time n is given by $$r_n = z_n + w_n = \sum_{i=0}^{L} f_i \cdot a_{n-i} + w_n, \quad (2)$$

where $z_n$ is the ISI channel output, $\{f_i\}$, $0 \leq i \leq L$ are the channel coefficients, L is the channel memory, and $w_n$ is noise. The decision of a detector 120 that corresponds to $b_n$ is denoted by $b'_n$.

The ISI channel output $z_n$ depends on the current channel symbol $a_n$ and the past L transmitted channel symbols $\{a_{n-i}\}$, $1 \leq i \leq L$. This output can be described as a function of the L past transmitted channel symbols using a finite state machine (FSM) model, where the channel state at time n is defined by $$\alpha_n = (a_{n-1}, a_{n-2}, \ldots, a_{n-L}). \quad (3)$$

The channel state is equivalently defined in terms of the L past transmitted information bits:

$$\beta_n = (b_{n-1}, b_{n-2}, \ldots, b_{n-L}). \quad (4)$$

It is apparent from equations (3) or (4) that the number of channel states is given by $$2^L. \quad (5)$$

To simplify the notation, the integer value corresponding to the vector $(b_{n-1}, \ldots, b_{n-L+1}, b_{n-L})$ will be used to represent the channel state $\beta_n$. For example, $0_n$ will stand for $\beta_n(0, \ldots, 0,0)$ and $1_n$ will stand for $\beta_n=(0, \ldots, 0,1)$.

Figure 2:
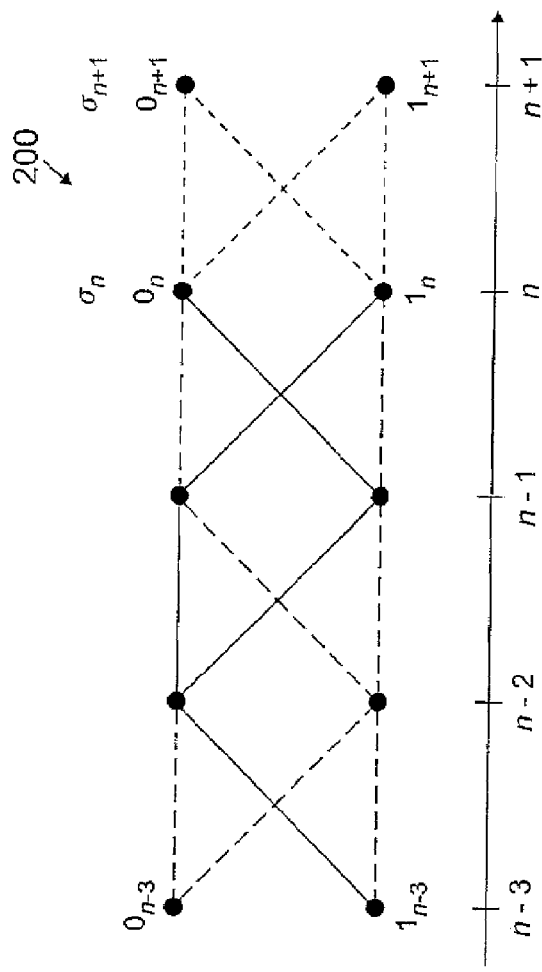
FIG. 2 illustrates a trellis diagram for a channel with memory L=1.

The FSM process describing the ISI channel 100 can be visualized using a trellis diagram 200, shown in FIG. 2, for a channel with memory L=1. For the considered exemplary uncoded channel model, a trellis state at time n is denoted by $\sigma_n$, and is equal to the channel state, i.e., $\sigma_n=\beta_n$. In FIG. 2, solid lines correspond to survivor paths, dotted lines to discarded transitions, and dashed lines to path extensions. There are two channel states, and two branches corresponding to the information symbols $b_n=0$ and $b_n=1$ leave each state $\sigma_n$ to reach respective successor states $\{\sigma_{n+1}\}$. It can be seen from equation (5) that the number of channel states grows exponentially with respect to the channel memory FIG. 2 depicts the operation of the Viterbi algorithm at time step n. At this point, the Viterbi algorithm has already determined the survivor path into state $0_n$, which corresponds to the surviving state sequence $\{0_n, 1_{n-1}, 0_{n-2}, 1_{n-3}, \ldots\}$. The survivor path into state $1_n$ corresponds in this example to the state sequence $\{1_n, 0_{n-1}, 0_{n-2}, 1_{n-3}, \ldots\}$. Based on these two survivor paths, the Viterbi algorithm decides on the survivor paths into states $0_{n+1}$ and $1_{n+1}$, in the manner described below.

First, the Viterbi algorithm calculates branch metrics for the state transitions from $\sigma_n$ to $\sigma_{n+1}$. For a channel with additive white Gaussian noise, the optimum blanch metric is the Euclidean distance between the received symbol $r_n$ and the ideal ISI channel output $z_n$ that corresponds to the respective state transition. For a transition from state $\sigma_n$, the branch metric is given by $$\lambda_n(\sigma_n, a_n) = (r_n - z_n)^2 = \left( r_n - \sum_{i=0}^{L} f_i \cdot a_{n-i} \right)^2, \quad (6)$$

where $a_n$ is the channel symbol that is associated with a transition from state $\sigma_n$ to a successor state $\sigma_{n+1}$. The techniques described herein are independent from the way branch metrics are computed, i.e., branch metrics can also by computed by using the absolute value of the difference between the received symbol $r_n$ and the ideal ISI channel output $z_n$.

In the trellis 200 of FIG. 2, there ale two path extensions into any state $\sigma_{n+1}$, e.g., state $0_{n+1}$ can be reached from states $0_n$ and $1_n$. Out of the two path extensions into a particular state $\sigma_{n+1}$, the Viterbi algorithm keeps only the one extension with the smallest path metric, as it corresponds to the most likely path into this state. The metric for the path that emanates from state $\sigma_n$ and leads into $\sigma_{n+1}$ is calculated by adding the path metric for the preceding state $\sigma_n$, $\Gamma_n(\sigma_n)$ and the branch metric $\lambda_n(\sigma_n, a_n)$ for the transition.

The three operations to determine the best survivor path into a new state $\sigma_{n+1}$, i.e., adding up corresponding path metrics of predecessor states $\sigma_n$ and branch metrics for the extensions into the new state $\sigma_{n+1}$, comparing the path metrics of these extended sequences, and selecting the extension with the minimum path metric as the survivor sequence for the new state, are referred to as add-compare-select (ACS), which can be described by the following equation:

$$\Gamma_{n+1}(\sigma_{n+1}) = \min \left( \Gamma_n(\sigma_n) + \lambda_n(\sigma_n, a_n) \right). \quad (7)$$

As previously indicated, the invention can also be applied when branch metrics are computed differently. As known in the art, for certain branch metric definition, the best path into a state is given by the path with the maximum (instead of minimum) path metric. For such cases, the ACS operation described by equation (7) involves a maximum instead of a minimum operation.

Figure 3:
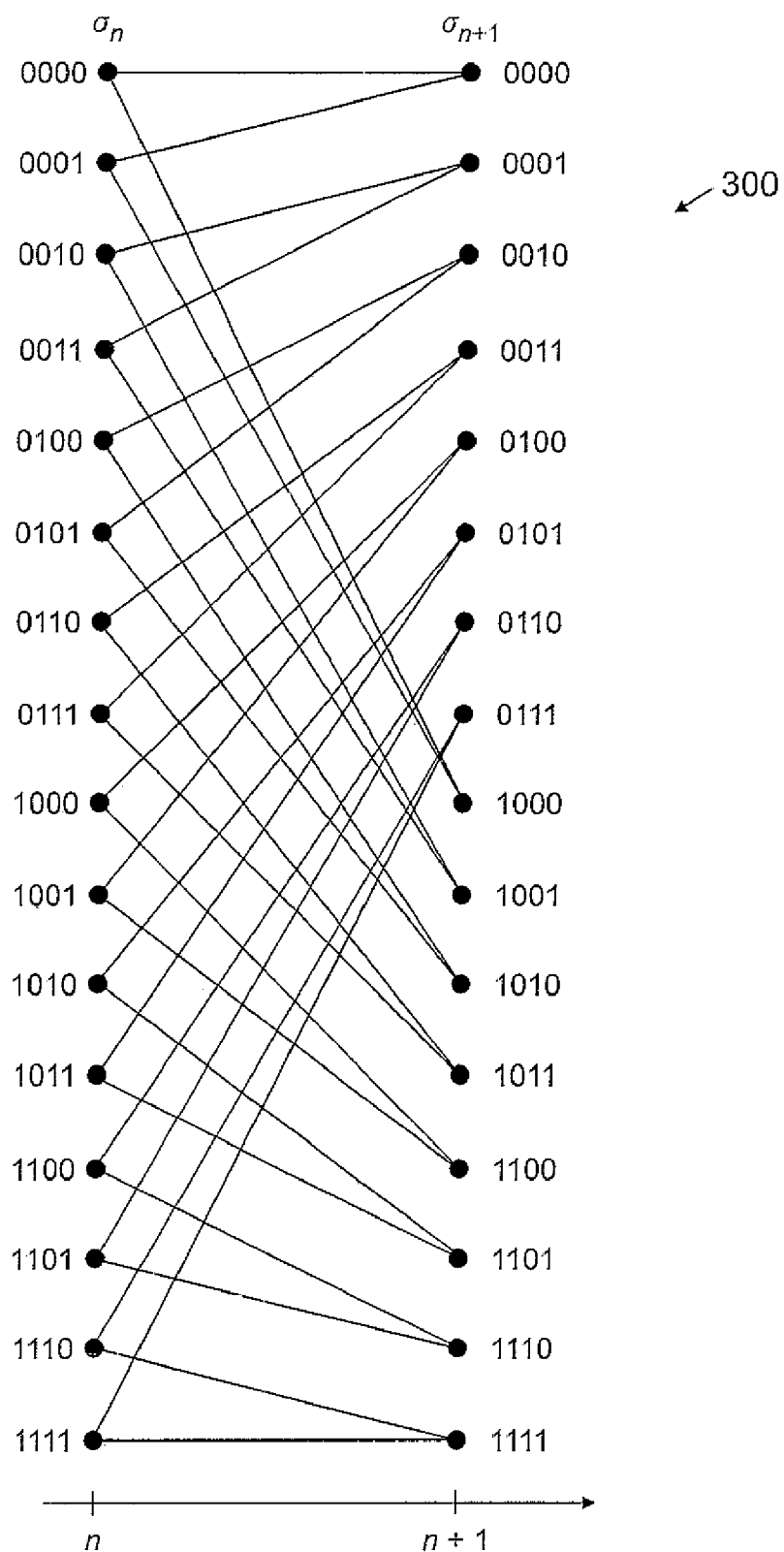
FIG. 3 illustrates a trellis diagram for a channel having a memory L=4.

In the example of FIG. 2, the two survivor sequences into states $0_n$ and $1_n$ merge into a single path at time step n−2. In general, all survivor paths merge into a single path after some detection delay D with high probability. Thus, information symbols can be uniquely detected from this time step on. Therefore, it is possible to implement the Viterbi algorithm with a fixed detection delay. It is not required to process the whole transmitted sequence before the first information symbols can be detected. Generally, the detection delay D should be approximately five times the memory of the underlying FSM process. For ISI channels, the memory is equal to L. Typically, a good value for D is determined by running error rate simulations for different values of D FIG. 3 illustrates a trellis 300 describing an ISI channel having a memory L=4. A trellis state at time n is denoted by $\sigma_n$, and for the considered exemplary uncoded channel model, it is equal to the channel state, i.e., $\sigma_n=\beta_n$. There are 16 channel states, and two branches corresponding to the information symbols $b_n=0$ and $b_n=1$ leave each state $\sigma_n$ to reach respective successor states $\{\sigma_{n+1}\}$.

Reduced-State Viterbi Detection with Local Feedback

As indicated above, the disadvantage of MLSE is that its complexity grows exponentially with the channel memory. Considering fewer states for the detection of the most likely data sequence reduces the required hardware or computational effort. Reduced-state Viterbi Detection with local feedback accomplishes this by merging several separate states into one single reduced state and keeping only one survivor path per reduced state. The ISI that is not considered in the reduced state is cancelled for each reduced-state by using channel symbols from the corresponding survivor path in a local feedback fashion. Reduced-state Viterbi detection with local feedback is also known as "Reduced-State Sequence Estimation (RSSE)", "(Delayed) Decision-Feedback Sequence Estimation", "Parallel Decision-Feedback Equalization", etc.

In the simplest variant of RSSE, a reduced state $\beta'_n$ is obtained by not considering all L information symbols, but only the past K information symbols for the definition of a trellis state:

$$\beta'_n = (b_{n-1}, b_{n-2}, \ldots, b_{n-K}), 0 \leq K \leq L, \quad (8)$$

where K is referred to as the truncated channel memory. The number of states in the reduced-state trellis is then given by $$2^K. \quad (9)$$

The reduced state $\beta'_n$ does not contain information about the ISI caused by the channel symbols $(a_{n-K-1}, a_{n-K-2}, \ldots, a_{n-L})$. Conceptually, this reduced state is obtained by grouping all original states $\beta_n$ as defined in Equation (4) with the same information symbol sequence $(b_{n-1}, b_{n-2}, \ldots, b_{n-K})$, but different sequences $(b_{n-K-1}, b_{n-K-2}, \ldots, b_{n-L})$ into one single reduced state $\beta'_n$. Therefore, this reduced state does not make any statement about the ISI associated with the channel coefficients $(f_{K+1}, f_{K+2}, \ldots, f_L)$. But an estimate for this ISI component can be computed by considering the respective channel symbols from the survivor sequence into this state. The ISI corresponding to a state is not known a-priori as in MLSE, but must be determined at each detection step by using channel symbols from the corresponding survivor path. Let $\sigma_n$ denote a state in the reduced-state trellis, i.e., $\sigma_n = \beta'_n$. The ISI estimate $u_n(\sigma_n)$ for a state $\sigma_n$ is calculated at time step n as $$u_n(\sigma_n) = \sum_{i=1}^{K} f_i \cdot a_{n-i} + \sum_{i=K+1}^{L} f_i \cdot \hat{a}_{n-i}(\sigma_n), \quad (10)$$

where $\hat{a}_{n-i}(\sigma_n)$ is the channel symbol that corresponds to the survivor sequence into state $\sigma_n$ and that is associated with trellis step n−i The first term on the right hand side of equation (10) computes the ISI component that is known a-priori due to the definition of the reduced state in equation (8). The second term on the right hand side of equation (10) is the ISI component caused by channel taps that were ignored in the reduced-state definition of equation (8). This ISI term is calculated at each detection step for a given state by using respective survivor symbols as local feedback.

With the ISI estimate $u_n(\sigma_n)$, the branch metric for the transition that emanates from state $\sigma_n$ to reach a successor state $\sigma_{n+1}$ and corresponds to channel symbol $a_n$ can be computed as:

$$\lambda_n(\sigma_n, a_n) = (r_n - f_0 \cdot a_n - u_n(\sigma_n))^2. \quad (11)$$

As in MLSE, the most likely survivor path into the state $\sigma_{n+1}$ with the path metric $\Gamma_{n+1}(\sigma_{n+1})$ among the path extensions from all possible predecessor states $\{\sigma_n\}$ is determined with an ACS operation:

$$\Gamma_{n+1}(\sigma_{n+1}) = \min_{\{\sigma_n\} \mapsto \sigma_{n-1}} (\Gamma_n(\sigma_n) + \lambda_n(\sigma_n, a_n)). \quad (12)$$

The version of RSSE where a reduced state is defined by considering just a truncated channel memory as in equation (8) is referred to as (Delayed) Decision-Feedback Sequence Estimation (DFSE), described, for example, in A. Duel-Hallen and C. Heegard, "Delayed Decision-Feedback Sequence Estimation," IEEE Transaction on Communications, 428-436 (May 1989). A reduced-state trellis can also be constructed by applying set partitioning principles to the channel symbol alphabet, as suggested in M. V. Eyuboglu and S. U. Qureshi, "Reduced-State Sequence Estimation With Set Partitioning and Decision-Feedback," IEEE Transactions on Communications, 13-20 (January 1988). Recently, even more general rules for the definition of reduced states were given in B. E. Spinnler and J. Huber, "Design of Hyper States for Reduced-State Sequence Estimation,", AEÜ (Electronics and Communication), 17-26 (1996). The present invention can be applied to such general RSSE methods. In addition, the present invention can be applied to another subclass of RSSE, referred to as Parallel Decision-Feedback Equalization, described in Lee and Messerschmidt, "Digital Communication," $2^{nd}$ ed. (1994). These publications are each incorporated by reference herein.

Figure 4:
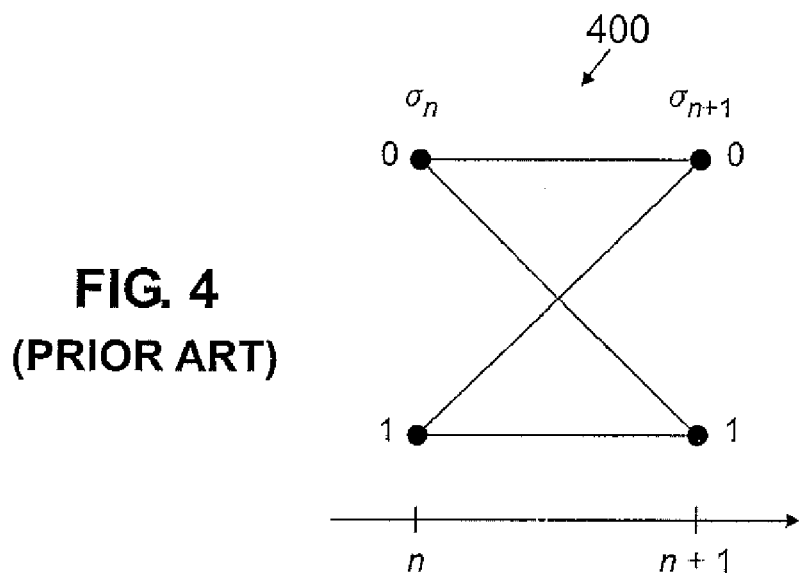
FIG. 4 illustrates a reduced-state trellis diagram corresponding to the full-state trellis of FIG. 3, for a channel having a memory L=4 and a shortened channel memory K=1.

Now, RSSE will be explained for the case that L=4 and K=1. Then, a state in the reduced-state trellis is defined according to equation (8) as:

$$\beta'_n = (b_{n-1}) \quad (13)$$

and the number of states in the reduced-state trellis is equal to $2^1=2$. FIG. 4 illustrates the reduced-state trellis 400 corresponding to the full state trellis 300 of FIG. 3 that describes an ISI channel having a memory L=4. A state at time n in the reduced-state trellis is denoted by $\sigma_n$, i.e., $\sigma_n = \beta'_n$. There are two channel states, and two branches corresponding to the information symbols $b_n=0$ and $b_n=1$ leave each state $\sigma_n$ to reach respective successor states $\{\sigma_{n+1}\}$.

Figure 5:
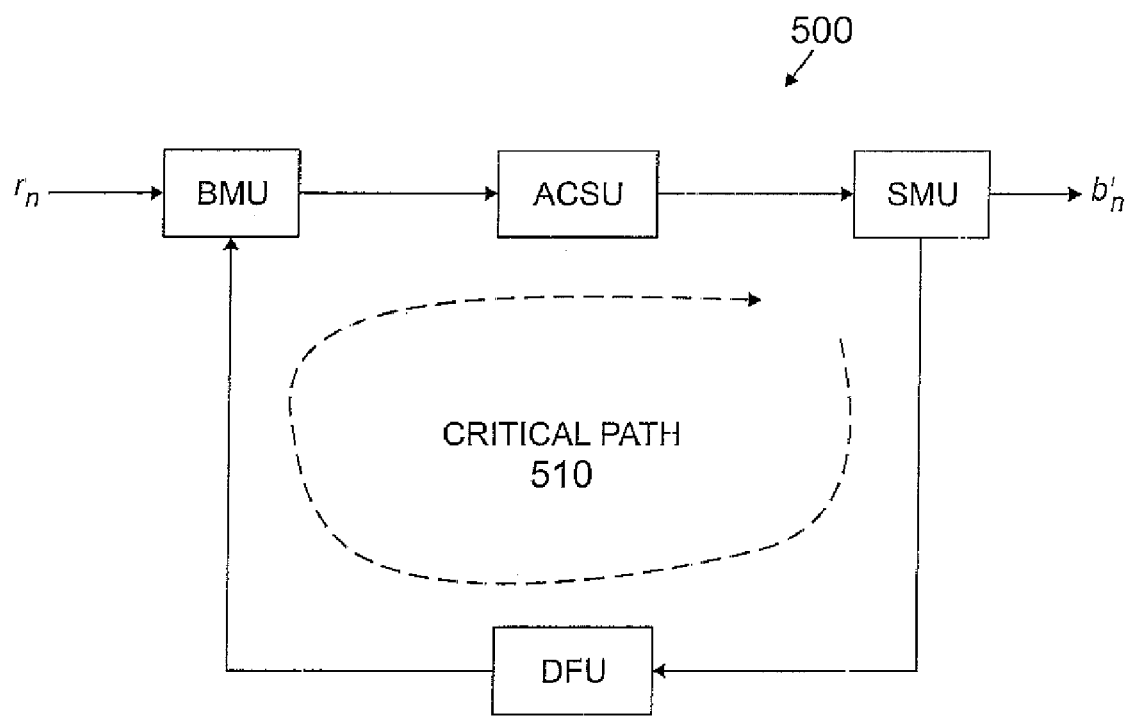
FIG. 5 is a schematic block diagram for an exemplary conventional reduced-state Viterbi detector with local feedback.

FIG. 5 is a schematic block diagram for an exemplary conventional reduced-state Viterbi detector 500 with local feedback. As shown in FIG. 5, the reduced-state detector 500 includes a decision-feedback unit (DFU) that computes separate ISI estimates for each trellis state according to equation (10) using local feedback, a branch metric unit (BMW) that computes branch metrics for all transitions, an add-compare-select unit (ACSU) that determines the best survivor path into each state, and a survivor memory unit (SMU) that stores the survivor paths.

As shown in FIG. 5, due to the local feedback the critical path 510 is comprised of a recursive loop that includes each of the processing blocks (i.e., the BMU, ACSU, SMU and DFU). As all operations along this critical path 510 have to be performed within one clock period, this recursive loop limits the maximum achievable data rate. Therefore, the maximum data rate of a reduced-state Viterbi detector with local feedback is significantly lower than the maximum data rate of a Viterbi detector without local feedback, which is only limited by the ACS function.

Figure 6:
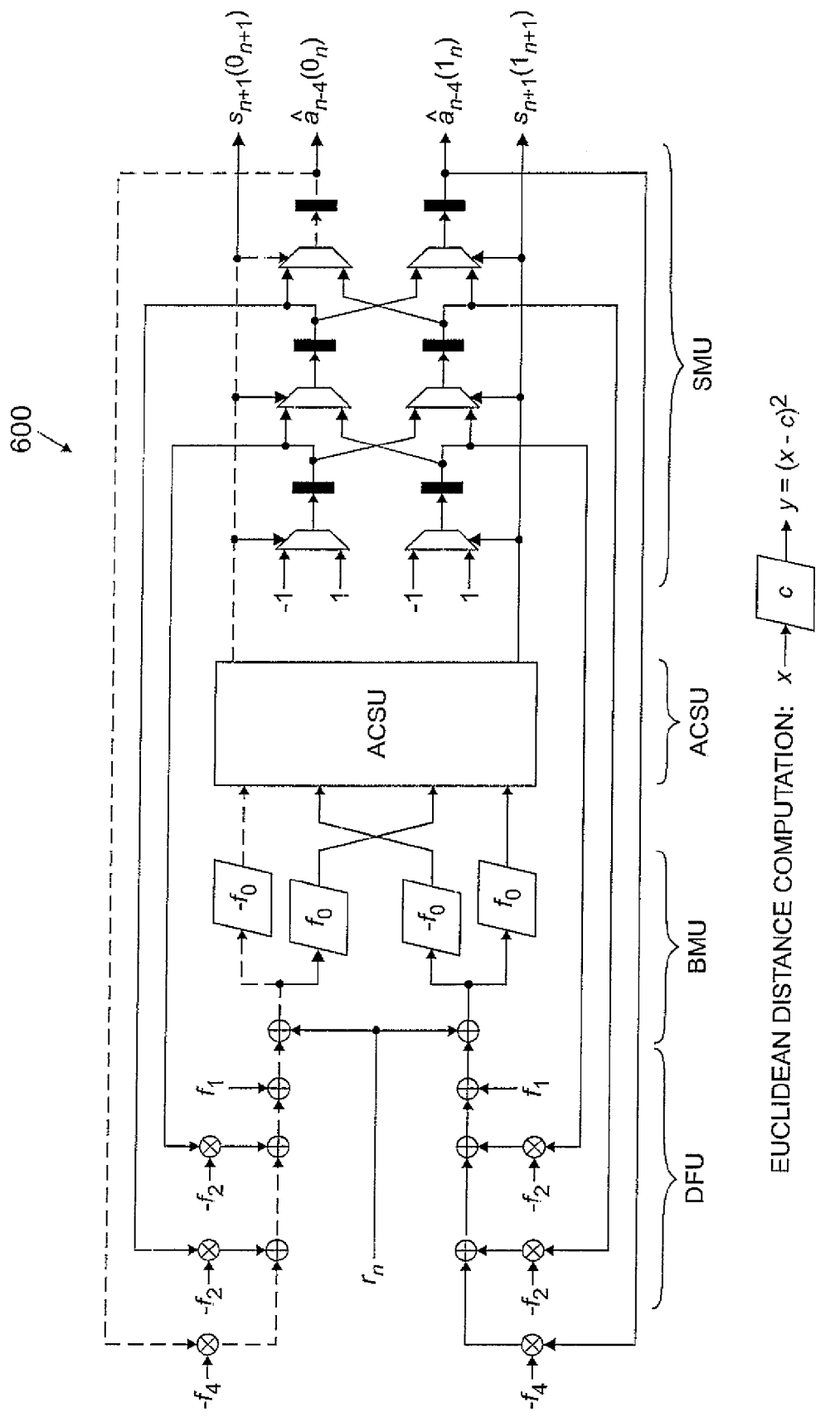
FIG. 6 illustrates a detailed state-parallel implementation of a reduced-state Viterbi detector with local feedback corresponding to the trellis of FIG. 4.

FIG. 6 illustrates a detailed state-parallel reduced-state Viterbi detector implementation 600 with local feedback corresponding to the trellis 400 of FIG. 4, having a memory L=4 and a shortened channel memory K=1. $\hat{a}_{n-4}(0_n)$ is the survivor symbol for time step n−4 from the survivor path into state $0_n$. $s_{n+1}(0_{n+1})$ is the ACS decision for the two path extensions into state $0_{n+1}$. The part of the SMU that stores the L−K survivor symbols $\hat{a}_{n-K-1}(\sigma_n), \hat{a}_{n-K-2}(\sigma_n), \ldots, \hat{a}_{n-L}(\sigma_n)$ for each reduced state is implemented with a register-exchange-architecture, as these decisions are required for the computation of ISI estimates in the DFU without delay. The implementation of the SMU using a register-exchange architecture is described, e.g., in R. Cypher and C. B. Shung, "Generalized Trace-Back Techniques for Survivor Memory Management in the Viterbi Algorithm," Journal of VLSI Signal Processing, 85-94 (1993). Because the discussed exemplary channel uses two signal levels, the multipliers in the DFU can be implemented with a shift operation. The squaring operation for the Euclidean distance computation in the BMU can be approximated using random logic or a look-up table.

Reduced-state Viterbi detection with local feedback that implements, e.g., RSSE, is associated with less computational complexity than full-state Viterbi detection that implements MLSE for the same channel memory L, as it processes less states. However, this comes at the expense of a significantly longer critical path, which is drawn in FIG. 6 using dotted lines. The critical path comprises one symbol multiplication and L−K additions in the DFU (the first term in the right hand side of equation (10) can be computed outside the loop), one addition, subtraction and squaring operation in the BMU, one add-compare in the ACSU, and a 2-to-1 MUX in the SMU. All the operations along this critical path must be completed within one symbol period and cannot be pipelined. In contrast to this, the critical path in a Viterbi detector just comprises the ACS operation. Therefore, the maximum data rate of a reduced-state Viterbi detector implementation with local feedback is potentially significantly lower compared to a Viterbi detector that per forms MLSE. Furthermore, the maximum throughput of a reduced-state Viterbi detector implementation with local feedback depends on the channel memory such that it decreases for increasing L.

Precomputation Architecture

The present invention employs two techniques to increase the maximum data rate that may be achieved by the reduced-state sequence estimator 500. First, as discussed below in conjunction with FIGS. 7-11, branch metrics, ISI-free signal estimates or ISI estimates are precomputed, and the correct values are selected based on survivor symbols or ACS decisions. In this manner, the computations of ISI estimates, ISI-free signal estimates or branch metrics are removed from the critical path. Second, branch metrics, ISI-free signal estimates or ISI estimates can be selected in a pipelined fashion using a multiplexer network structure that corresponds to the structure of the trellis considered by the detector; as shown in FIGS. 12-16.

Figure 7:
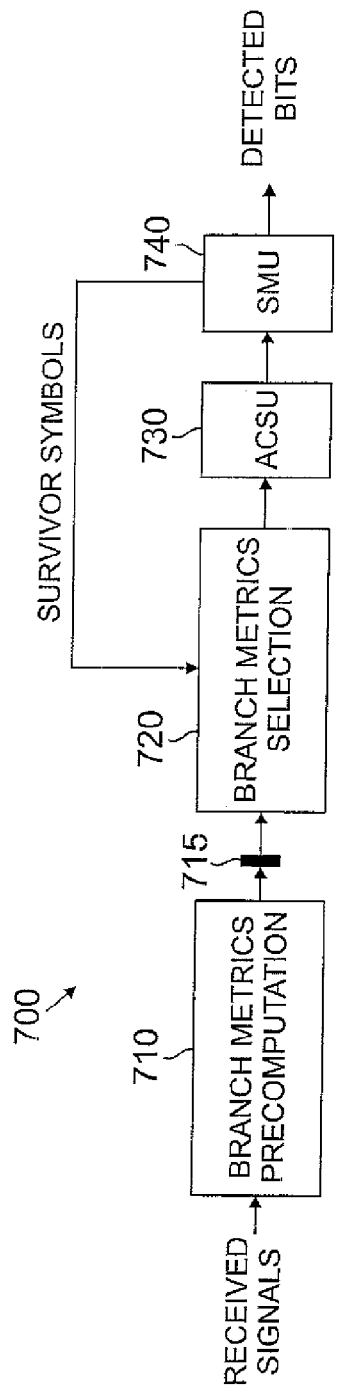
FIG. 7 is a schematic block diagram of a reduced-state Viterbi detector that incorporates precomputation of the branch metrics.

FIG. 7 is a schematic block diagram of a reduced-state Viterbi detector 700 with local feedback incorporating features of the present invention. As shown in FIG. 7, the branch metric computation is removed from the critical path by precomputing branch metrics at stage 710. For a detailed discussion of the precomputation of branch metrics for a trellis, see, for example, U.S. patent application Ser. No. 09/471,920, entitled, "Method and Apparatus for Shortening the Critical Path of Reduced Complexity Sequence Estimation Techniques," incorporated by reference herein.

The correct branch metrics are selected at stage 720, discussed below in conjunction with FIG. 8, based on survivor symbols. As previously indicated, the data rate can be increased by precomputing branch metrics and selecting the appropriate ones based on past survivor symbols. As shown in FIG. 7, a pipeline stage 715 can be inserted between the branch metric precomputation 710 and branch metric selection 720. In the implementation shown in FIG. 7, the critical path comprises the branch metric selection 720, ACSU 730 and SMU 740. However, the computation of ISI estimates and branch metrics is not part of the critical path in contrast to the conventional reduced-state Viterbi detection implementation shown in FIG. 5.

In the exemplary uncoded channel model described above, the input into the reduced-state detector is given by equation (2), and a state in the reduced-state trellis is defined by equation (8). A state in the reduced-state trellis is denoted by $\sigma_n$, i.e., $\sigma_n = \beta'_n$. A branch metric for the transition from state $\sigma_n$ to $\sigma_{n+1}$ that corresponds to the information bit sequence $b_n$, $b_{n-1}, \ldots b_{n-L}$ is given by $$\lambda_n(b_n b_{n-1} \ldots b_{n-L}) = \left(r_n - \sum_{i=0}^{L} f_i a_{n-i}\right)^2, \quad (14)$$

where $a_{n-i}$ is the channel symbol that corresponds to the information bit $b_{n-i}$. This is the same branch metric that was referred to as $\lambda_n(\sigma_n, a_n)$ in the context of equation (11). To account for all possible bit sequences, $2^{L+1}$ branch metrics have to be precomputed. For a transition from state $\sigma_n$ to $\sigma_{n+1}$, there are $2^{L-K}$ branch metric candidates that correspond to the same bit sequence $b_{n-1}, b_{n-2}, \ldots, b_{n-K}$, which is determined by $\sigma_n$, but different speculative bit sequences $b_{n-K-1}$, $b_{n-K-2}, \ldots, b_{n-L}$. For each state and transition in the reduced-state trellis, the appropriate branch metric is selected based on the L-K survivor symbols $\hat{a}_{n-K-1}, \hat{a}_{n-K-2}, \ldots, \hat{a}_{n-L}$ that correspond to this state. The selection of the branch metric associated with the transition from state $\sigma_n = 0_n$ to $\sigma_{n+1} = 0_{n+1}$ is shown in FIG. 8, where L=4 and K=1.

Figure 8:
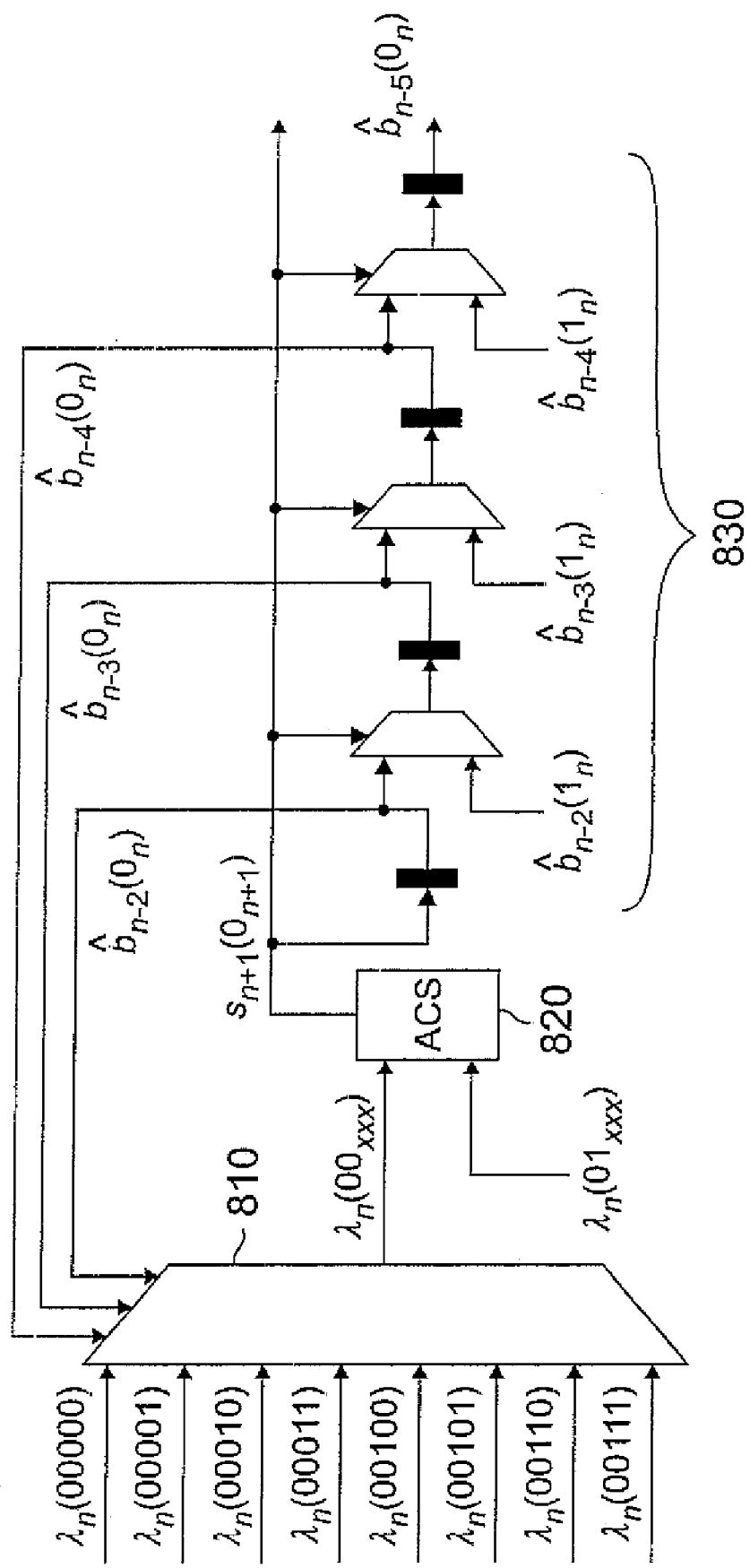
FIG. 8 is a schematic block diagram showing the selection of a precomputed branch metric by the reduced-state Viterbi detector of FIG. 7 using survivor symbols.

FIG. 8 is a schematic block diagram showing the selection of a branch metric 720 using survivor symbols, the ACS operation 730 and the survivor memory operation 740, as performed by the reduced-state Viterbi detector of FIG. 7. Only the selection of one branch metric, and the ACS operation and survivor memory operation for one state are shown. The detector of FIG. 7 would implement the circuits of FIG. 8 for all required branch metrics and states. In FIG. 8, $\lambda_n(00xxx)$ is the selected branch metric for a transition from state $0_n$ that corresponds to the bit sequence $b_n=0$, $b_{n-1}=0$, $b_{n-2}=\hat{b}_{n-2}(0_n)$, $b_{n-3}=\hat{b}_{n-3}(0_n)$ and $b_{n-4}=\hat{b}_{n-4}(0_n)$. A $2^{L-K}$-to-1 multiplexer 810 is required to select the correct branch metric among the precomputed ones. The critical path just comprises the multiplexer 810 for the branch metric selection and an add-compare-select 820. This is significantly shorter compared to a conventional RSSE implementation, as the computation of branch metrics is outside the critical path. Except for the multiplexer 810, the critical path in this RSSE architecture with precomputed branch metrics is the same as in a Viterbi detector that implements MLSE without any decision-feedback.

Figure 9:
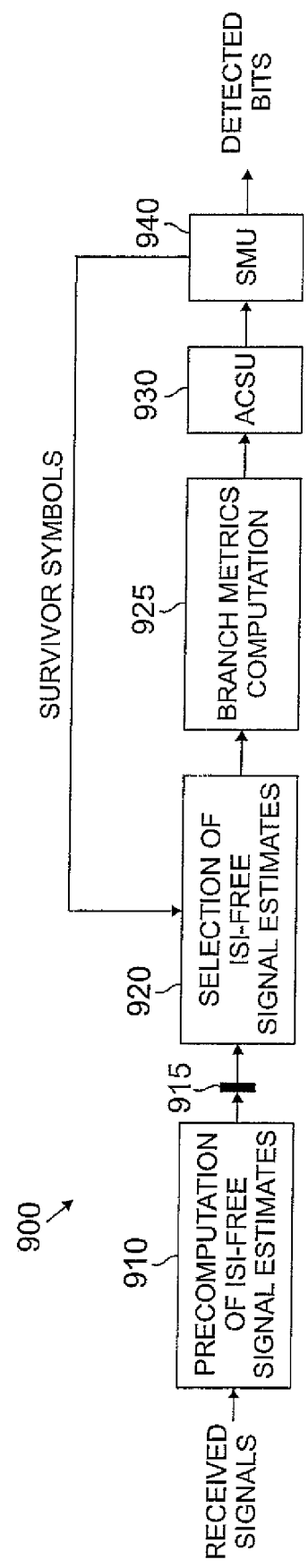
FIG. 9 is a schematic block diagram of a reduced-state Viterbi detector that incorporates precomputation of the ISI-free signal estimates.

To reduce the hardware for the precomputation, the branch metrics do not have to be fully precomputed. Instead, ISI-free signal estimates can be precomputed, and branch metrics are then calculated using the correct ISI-free signal estimates that are selected based on past survivor symbols as shown in FIG. 9. An ISI-free signal estimate that corresponds to the bit sequence $b_{n-1}, b_{n-2}, \ldots, b_{n-L}$ is given by $$q_n(b_{n-1} b_{n-2} \ldots b_{n-L}) = r_n - \sum_{i=1}^{L} f_i \cdot a_{n-i}. \quad (15)$$

In total, $2^L$ ISI-free signal estimates have to be precomputed, but only $2^{K+1}$ branch metrics are calculated in this architecture. However, the Euclidean distance metric computation, $$\lambda_n = (q_n - f_0 a_n)^2 \quad (16)$$

is in the critical path, while the computation of ISI-free signal estimates is outside the critical path.

FIG. 9 is a schematic block diagram of a reduced-state Viterbi detector 900 incorporating pipelining of the ISI-free signal estimate computation in accordance with the present invention. As shown in FIG. 9, the ISI-free signal estimate computation is removed from the critical path by precomputing ISI-free signal estimates at stage 910.

The correct ISI-free signal estimates are selected at stage 920, discussed below in conjunction with FIG. 10, based on survivor symbols. As previously indicated, the data rate can be increased by precomputing ISI-free signal estimates and selecting the appropriate ones based on past survivor symbols. As shown in FIG. 9, a pipeline stage 915 can be inserted between the ISI-free signal estimate precomputation 910 and ISI-free signal estimate selection 920. In the implementation shown in FIG. 9, the critical path comprises the ISI-free signal estimate selection 920, branch metrics computation 925, ACSU 930 and SMU 940. However, the computation of ISI-free signal estimates is not part of the critical path in contrast to the conventional reduced-state Viterbi detection implementation shown in FIG. 5.

Figure 10:
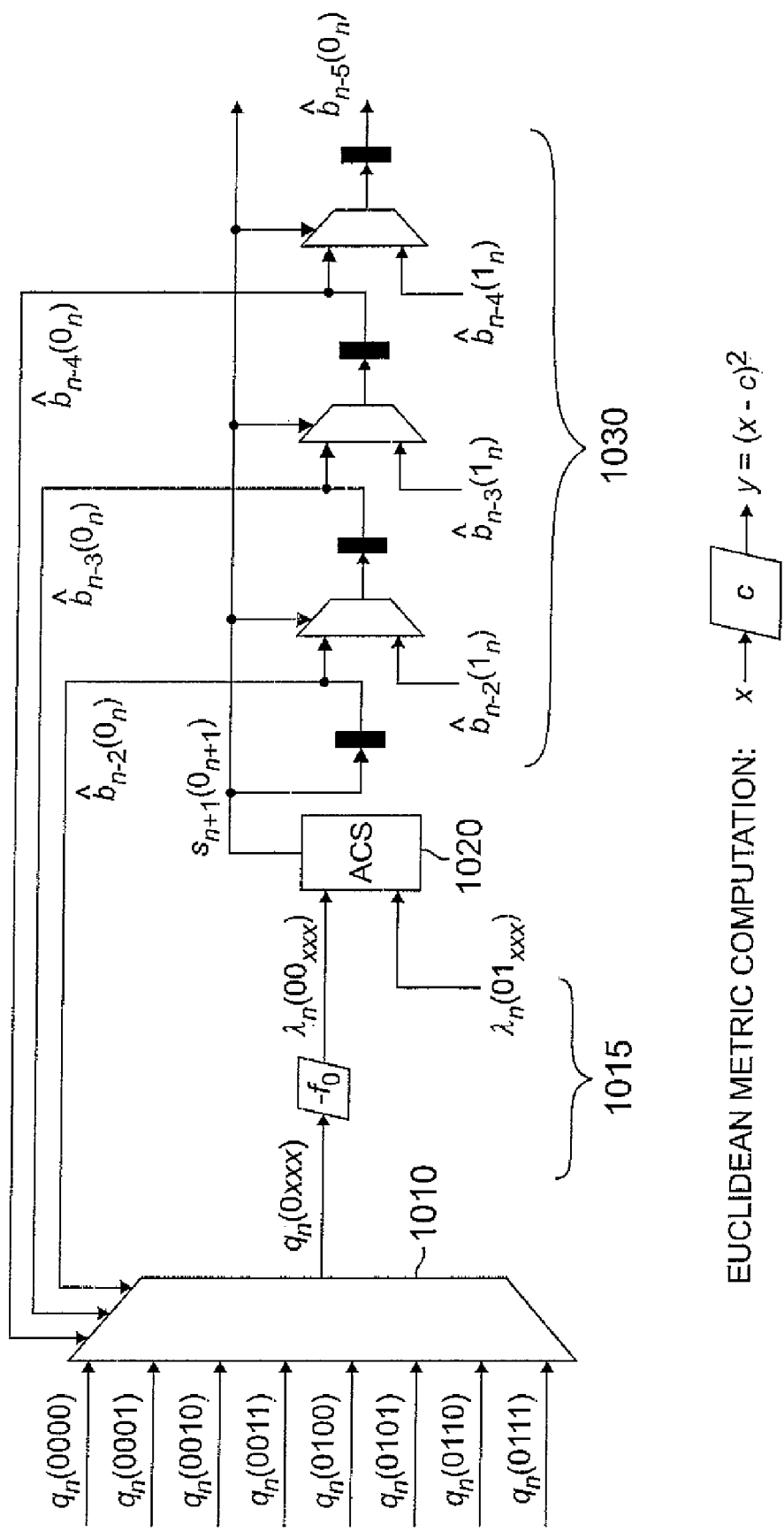
FIG. 10 is a schematic block diagram showing the selection of a precomputed ISI-free signal estimate by the reduced-state Viterbi detector of FIG. 9 using survivor symbols.

FIG. 10 is a schematic block diagram showing the selection of an ISI-free signal estimate 920 using survivor symbols, the branch metric computation 925, the ACS operation 930 and the survivor memory operation 940, as performed by the reduced-state Viterbi detector of FIG. 9. Only the selection of one ISI-free signal estimate, the computation of one branch metric, and the ACS operation and survivor memory operation for one state are shown. The detector of FIG. 9 would implement the circuits of FIG. 10 for all required ISI-free signal estimates, branch metrics and states. In FIG. 10, $q_n(0xxx)$ is the selected ISI-free signal estimate for a transition from state $0_n$ that corresponds to the bit sequence $b_{n-1}=0$, $b_{n-2}=\hat{b}_{n-2}(0_n)$, $b_{n-3}=\hat{b}_{n-3}(0_n)$ and $b_{n-4}=\hat{b}_{n-3}(0_n)$. A $2^{L-K}$-to-1 multiplexer 1010 is required to select the correct ISI-free signal estimate among the precomputed ones. The critical path just comprises the multiplexer 1010 for the ISI-free signal estimate selection, the branch metric computation 1015 and an add-compare-select 1020. This is significantly shorter compared to a conventional RSSE implementation, as the computation of the ISI-free signal estimates is outside the critical path.

Figure 11:
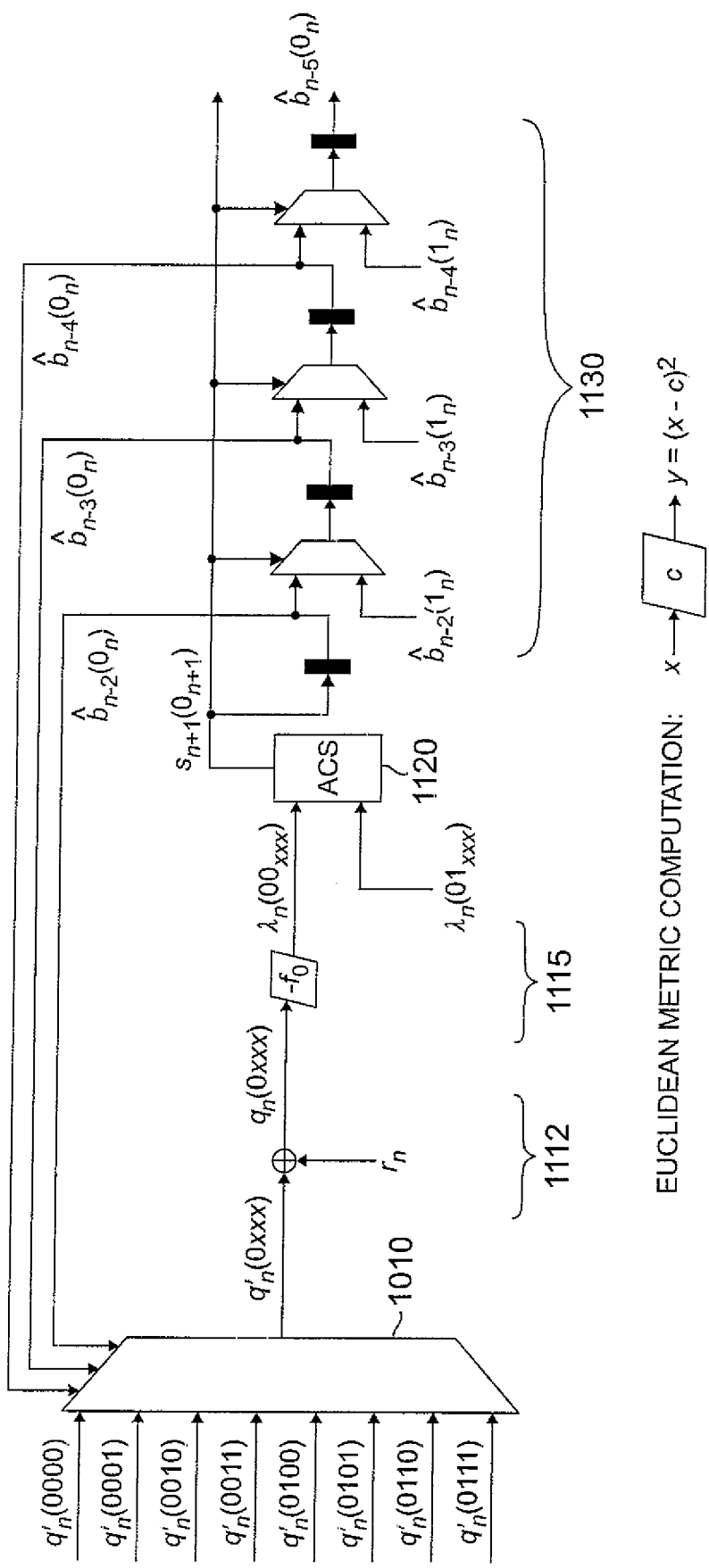
FIG. 11 is a schematic block diagram showing the selection of a precomputed intersymbol interference estimate using survivor symbols.

To reduce the hardware for the precomputation even further, ISI estimates instead of ISI-free signal estimates can be precomputed, and ISI-free signal estimates and branch metrics are then calculated using the correct ISI estimates that are selected based on past survivor symbols as shown in FIG. 11.

The inverse of an ISI estimate that corresponds to the bit sequence $b_{n-1}, b_{n-2}, \ldots, b_{n-L}$ is given by $$q'_n(b_{n-1} b_{n-2} \ldots b_{n-L}) = -\sum_{i=1}^{L} f_i \cdot a_{n-i}. \quad (17)$$

In total, $2^L$ ISI estimates have to be precomputed, but only $2^K$ ISI-free signal estimates and $2^{K+1}$ branch metrics are calculated in this architecture. An ISI-free signal estimate is then computed according to:

$$q_n = r_n + q'_n, \quad (18)$$

and the corresponding branch metric is given by $$\lambda_n = (q_n - f_0 \cdot a_n)^2. \quad (19)$$

FIG. 11 is a schematic block diagram of an architecture that is a derivation of the architecture shown in FIG. 10. In FIG. 11, ISI estimates are precomputed, whereas in FIG. 10 ISI-free signal estimates are precomputed. In FIG. 11, an ISI-free signal estimate and branch metric are computed based on a selected ISI estimate. Survivor symbols are used to select the correct ISI estimate. While the architecture of FIG. 11 is associated with less hardware complexity than the architecture of FIG. 10, the critical path in FIG. 11 not only includes the branch metric computation 1115, but also the computation of an ISI-free signal estimate 1112. However, the critical path of this architecture is still shorter than the critical path of a conventional reduced-state Viterbi implementation shown in FIG. 6.

It is noted that the improved data rate achieved by the present invention comes at the expense of increased hardware complexity, as shown, for example, in FIGS. 8, 10 and 11, as several branch metric, ISI-free signal estimate or ISI estimate candidates are precomputed pet state transition in the trellis, while only one of these precomputed values is selected for the ACS operation. In contrast, the architecture of FIG. 6, that is associated with a significantly longer critical path, computes only one branch metric, ISI-free signal estimate and ISI estimate pet state transition.

Pipelined Selection

In the precomputation architectures of FIGS. 8 (branch metrics), 10 (ISI-free signal estimates) and 11 (intersymbol interference estimates), a $2^{L-K}$-to-1 multiplexer 810, 1010, 1110 lies in the critical path. Although the computation of the branch metrics, ISI-free signal estimates or ISI estimates is not part of the critical path anymore, the delay due to the multiplexer 810, 1010, 1110 still depends on the channel memory. In a straightforward tree-wise implementation of the $2^{L-K}$-to-1 multiplexer 810, 1010, 1110 using $2^{L-K}-1$ 2-to-1 multiplexers, the delay is equal to the delay of L-K 2-to-1 multiplexers, potentially mitigating the speed-up achieved by precomputing branch metrics, ISI-free signal estimates or ISI estimates.

The present invention recognizes that when branch metrics, ISI-free signal estimates or ISI estimates are precomputed L-K time steps in advance, they can be selected using L-K levels of 2-to-1 multiplexers that are driven by ACS decisions and where each level is associated with a pipeline stage. However, only a single 2-to-1 multiplexer is part of the critical path, and the delay associated with the selection of collect values becomes independent of the channel memory.

Figure 12:
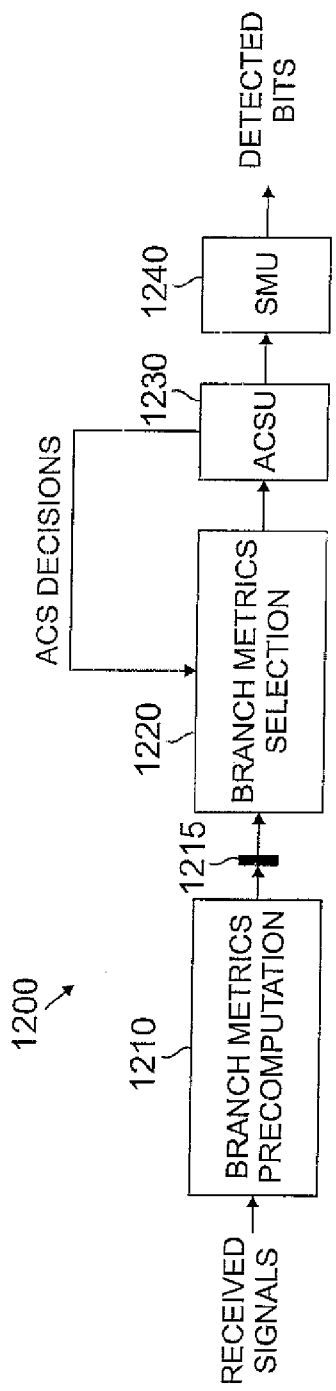
FIG. 12 is a schematic block diagram of a reduced-state Viterbi detector incorporating pipelining of the branch metric selection.

FIG. 12 is a schematic block diagram of a reduced-state Viterbi detector 1200 incorporating pipelining of the branch metric selection. As shown in FIG. 12, the branch metric computation is removed from the critical path by precomputing branch metrics at stage 1210. The correct blanch metrics are selected at stage 1220, discussed below in conjunction with FIG. 13, based on ACS decisions. As shown in FIG. 12, a pipeline stage 1215 can be inserted between the branch metric precomputation 1210 and branch metric selection 1220.

Figure 13:
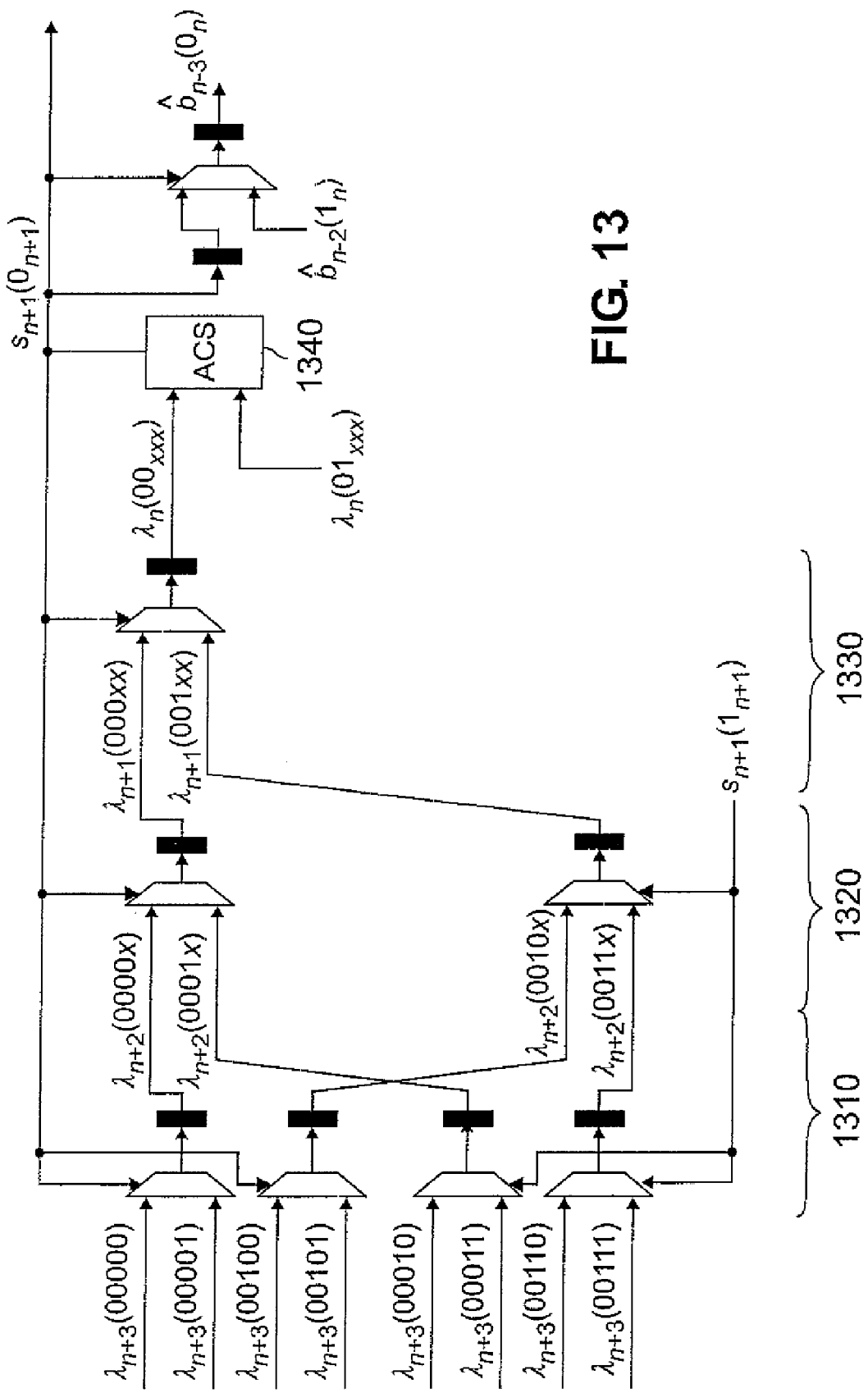
FIG. 13 is a schematic block diagram showing the pipelined selection of a branch metric by the reduced-state Viterbi detector of FIG. 12 using ACS decisions.

FIG. 13 is a schematic block diagram showing the pipelined selection of a blanch metric 1220 by the reduced-state Viterbi detector of FIG. 12 using ACS decisions. The exemplary embodiment shown in FIG. 13 shows the pipelined selection of branch metrics with three pipeline stages for L=4 and K=1. The critical path in this architecture just includes a 2-to-1 multiplexer, such as a multiplexer in stage 1310, 1320 or 1330, and an add-compare 1340 in the ACSU. The critical path is significantly shorter compared to FIG. 8, where an 8-to-1 multiplexer 810 lies in the critical path. In fact, it has the same length as in a Viterbi detector that implements MLSE without any decision-feedback.

In FIG. 13, branch metrics are precomputed L-K=3 time units in advance and then selected over three clock periods based on corresponding ACS decisions. As the ACS decision $s_{n+1}(\sigma_{n+1})$ determines the survivor symbol $\hat{a}_{n-K}(\sigma_{n+1})$, the appropriate branch metric can be selected among candidates that correspond to the same symbol sequence $a_{n+L-K}, a_{n+L-K-1}, \ldots, a_{n-K+1}$, but a different past symbol $a_{n-K}$. In FIG. 13, $s_{n+1}(0_{n+1})$ determines the surviving branch metric $\lambda_{n+3}$ (0000x) in the top multiplexer in stage 1310 among the candidates $\lambda_{n+3}$ (00000) and $\lambda_{n+3}$ (00001), where x is a dummy variable for the symbol $a_{n-1}$. Similarly, $s_{n+1}(0_{n+1})$ determines the surviving branch metric $\lambda_{n+2}$ (000xx) in the top multiplexer in stage 1320 among the candidates $\lambda_{n+2}$ (0000x) and $\lambda_{n+2}$ (0001x), where xx is a placeholder for the symbols $a_{n-1}$ and $a_{n-2}$. Finally, after selection by the multiplexer in stage 1330, just one surviving branch metric per transition remains, which is used in the ACSU 1340. The branch metric selection resembles the selection of survivor symbols in a SMU that is implemented according to the register exchange architecture. The total number of 2-to-1 multiplexers is $2^{L-K}-1$ and thus equal to the number of 2-to-1 multiplexers required for a straightforward tree-wise implementation of the 8-to-1 multiplexer in FIG. 8. Therefore, except for pipeline registers, the branch metric selection in FIG. 13 is associated with about the same complexity as the branch metric selection in FIG. 8.

Generally, branch metrics are precomputed two or more time units in advance and then selected over two or more clock periods. Each pipeline stage has one or more functional units, each comprised of a multiplexer and an associated pipeline register. An input to each functional unit comprises a plurality of precomputed branch metrics that form a subgroup and an output of each subgroup comprises a selected precomputed branch metric. As shown in FIG. 13, at each stage, such as stage 1310, the selected precomputed branch metrics are combined into one or more new subgroups for a following stage, such as stage 1320. In the exemplary embodiment shown in FIG. 13, the subgroups are combined based on the bit pattern of the selected precomputed branch metrics. For example, the selected precomputed branch metrics $l_{n+2}$ (0000x) and $l_{n+2}$(0001x) have similar bit patterns, other than the second-to-least significant bit and are combined for selection in the second stage 1320. Both branch metrics $l_{n+2}$ (0000x) and $l_{n+2}$(0001x) correspond to a bit pattern that agrees in the first three bit positions.

Figure 14:
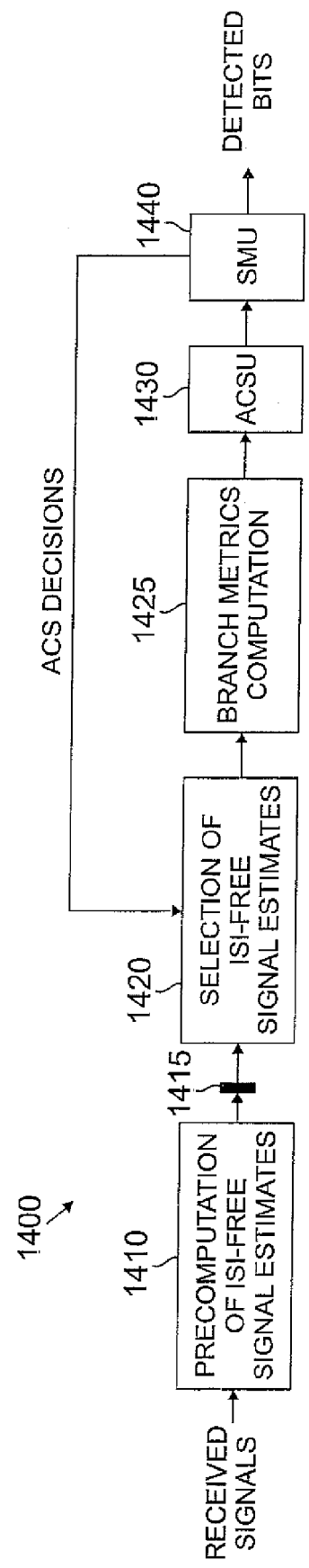
FIG. 14 is a schematic block diagram of a reduced-state Viterbi detector that incorporates pipelining of the ISI-free signal estimate selection.

FIG. 14 is a schematic block diagram of a reduced-state Viterbi detector 1400 that incorporates pipelining of the ISI-free signal estimate selection. As shown in FIG. 14, the ISI-free signal estimate computation is removed from the critical path by precomputing ISI-free signal estimates at stage 1410. The correct ISI-free signal estimates are selected at stage 1420, discussed below in conjunction with FIG. 15, based on ACS decisions. As shown in FIG. 14, a pipeline stage 1415 can be inserted between the ISI-free signal estimate precomputation 1410 and ISI-free signal estimate selection 1420.

Figure 15:
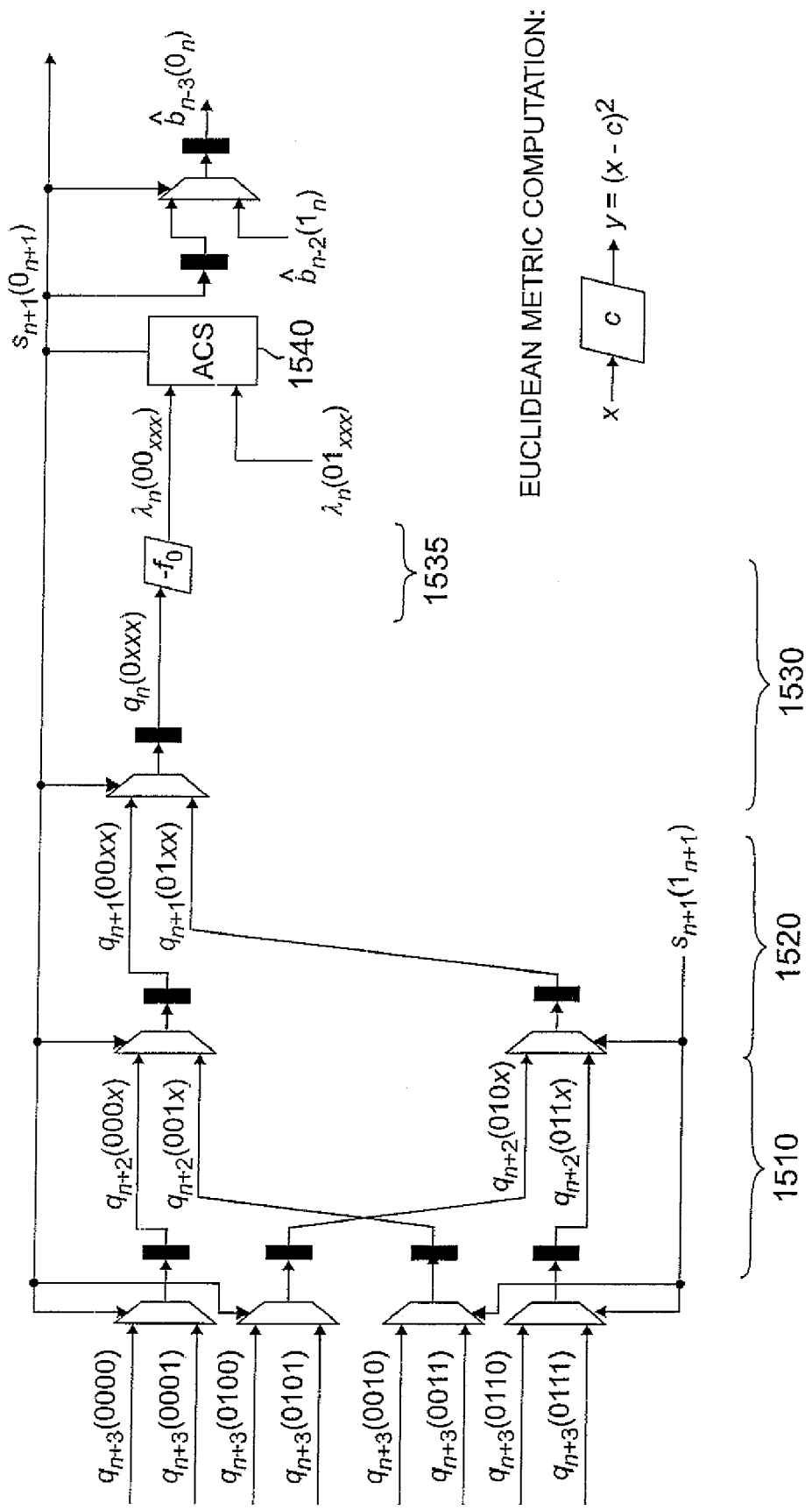
FIG. 15 is a schematic block diagram showing the pipelined selection of an ISI-free signal estimate by the reduced-state Viterbi detector of FIG. 14 using ACS decisions.

FIG. 15 is a schematic block diagram showing the pipelined selection of an ISI-free signal estimate 1420 by the reduced-state Viterbi detector of FIG. 14 using ACS decisions. The selection of ISI-free signal estimates resembles the selection of branch metrics, discussed above in conjunction with FIG. 13. The exemplary embodiment shown in FIG. 15 shows the pipelined selection of an ISI-free signal estimate with three pipeline stages for L=4 and K=1. The critical path in this architecture just includes a 2-to-1 multiplexer, such as a multiplexer in stage 1510, 1520 or 1530, an add-compare 1540 in the ACSU and a branch metric computation 1535. The critical path is significantly shorter compared to FIG. 10, where an 8-to-1 multiplexer 1010 lies in the critical path.

In FIG. 15, ISI-free signal estimates are precomputed L−K=3 time units in advance and then selected over three clock periods based on corresponding ACS decisions. As the ACS decision $s_{n+1}(\sigma_{n+1})$ determines the survivor symbol $\hat{a}_{n-K}(\sigma_{n+1})$, the appropriate ISI-free signal estimate can be selected among candidates that correspond to the same symbol sequence $a_{n+L-K}, a_{n+L-K-1}, \ldots, a_{n-K+1}$, but a different past symbol $a_{n-K}$. In FIG. 15, $s_{n+1}(0_{n+1})$ determines the surviving intersymbol interference estimate $q_{n+3}(000x)$ in the top multiplexer in stage 1510 among the candidates $q_{n+3}(0000)$ and $q_{n+3}(0001)$, where x is a dummy variable for the symbol $a_{n-1}$. Similarly, $s_{n+1}(0_{n+1})$ determines the surviving branch metric $q_{n+2}(00xx)$ in the top multiplexer in stage 1520 among the candidates $q_{n+2}(000x)$ and $q_{n+2}(001x)$, where xx is a placeholder for the symbols $a_{n-1}$ and $a_{n-2}$. Finally, after selection by the multiplexer in stage 1530, just one surviving ISI-free signal estimate per transition remains, which is used for the branch metric computation 1535.

Generally, intersymbol interference-free signal estimates are precomputed two or more time units in advance and then selected over two or more clock periods. Each pipeline stage has one or more functional units, each comprised of a multiplexer and an associated pipeline register. An input to each functional unit comprises a plurality of precomputed intersymbol interference-free signal estimates that form a subgroup and an output of each subgroup comprises a selected precomputed intersymbol interference-free signal estimate. As shown in FIG. 15, at each pipeline stage, such as stage 1510, the selected precomputed intersymbol interference-free signal estimates are combined into one or more new subgroups for a following pipeline stage, such as stage 1520. In the exemplary embodiment shown in FIG. 15, the subgroups are combined based on the bit pattern of the selected precomputed intersymbol interference-free signal estimates. For example, the selected precomputed intersymbol interference-free signal estimates $q_{n+2}(000x)$ and $q_{n+2}(001x)$ have similar bit patterns, other than the second-to-least significant bit and are combined for selection in the second stage 1520. Both intersymbol interference-free signal estimates $q_{n+2}(000x)$ and $q_{n+2}(001x)$ correspond to a bit pattern that agrees in the first two bit positions.

Figure 16:
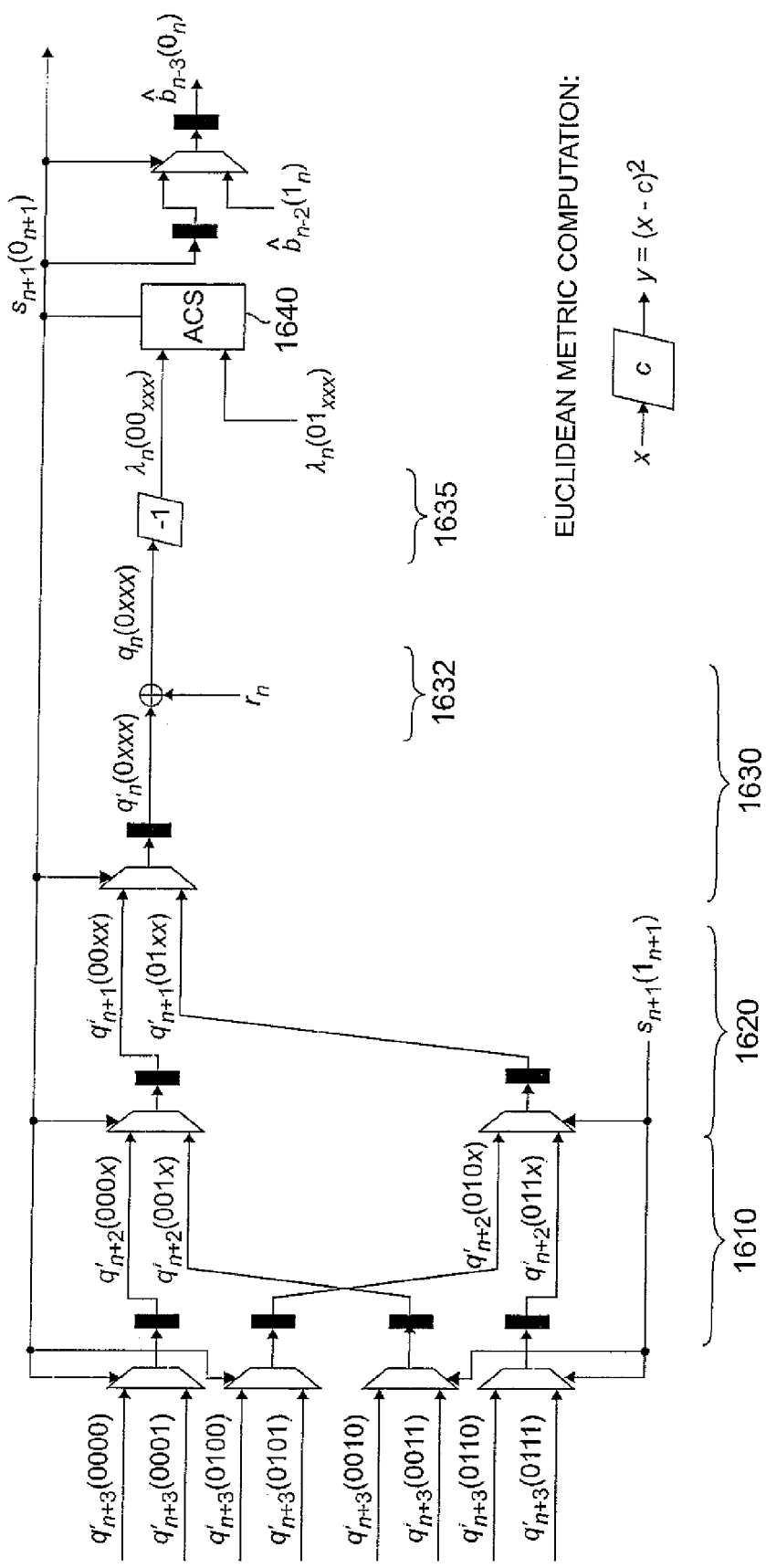
FIG. 16 is a schematic block diagram showing the pipelined selection of an inter symbol interference estimate using ACS decisions.

FIG. 16 is a schematic block diagram showing the pipelined selection of an intersymbol interference estimate using ACS decisions according to the invention. In FIG. 16, ISI estimates instead of ISI-free signal estimates are selected in a pipelined fashion. The ISI estimates are precomputed according to equation (17). The intersymbol interference estimate selection resembles the selection of the ISI-free signal estimate, discussed above in conjunction with FIG. 15. The exemplary embodiment shown in FIG. 16 shows the pipelined selection of intersymbol interference estimates with three pipeline stages for L=4 and K=1. The critical path in this architecture just includes a 2-to-1 multiplexer, such as a multiplexer in stage 1610, 1620 or 1630, an ISI-free signal estimate computation 1632, a branch metric computation 1635, and an add-compare 1640 in the ACSU. The critical path is significantly shorter compared to FIG. 11, where an 8-to-1 multiplexer 1110 lies in the critical path.

In FIG. 16, intersymbol interference estimates are precomputed L−K=3 time units in advance and then selected over three clock periods based on corresponding ACS decisions. As the ACS decision $s_{n+1}(\sigma_{n+1})$ determines the survivor symbol $\hat{a}_{n-K}(\sigma_{n+1})$, the appropriate intersymbol interference estimate can be selected among candidates that correspond to the same symbol sequence $a_{n+L-K}, a_{n+L-K-1}, \ldots, a_{n-K+1}$, but a different past symbol $a_{n-K}$. In FIG. 16, $s_{n+1}(0_{n+1})$ determines the surviving intersymbol interference estimate $q'_{n+3}(000x)$ in the top multiplexer in stage 1610 among the candidates $q'_{n+3}(0000)$ and $q'_{n+3}(0001)$, where x is a dummy variable for the symbol $a_{n-1}$. Similarly, $s_{n+1}(0_{n+1})$ determines the surviving branch metric $q'_{n+2}(00xx)$ in the top multiplexer in stage 1620 among the candidates $q'_{n+2}(000x)$ and $q'_{n+2}(001x)$, where xx is a placeholder for the symbols $a_{n-1}$ and $a_{n-2}$. Finally, after selection by the multiplexer in stage 1630, just one surviving intersymbol interference estimate per transition remains, which is used for the ISI-free signal estimate computation 1632.

Figure 17:
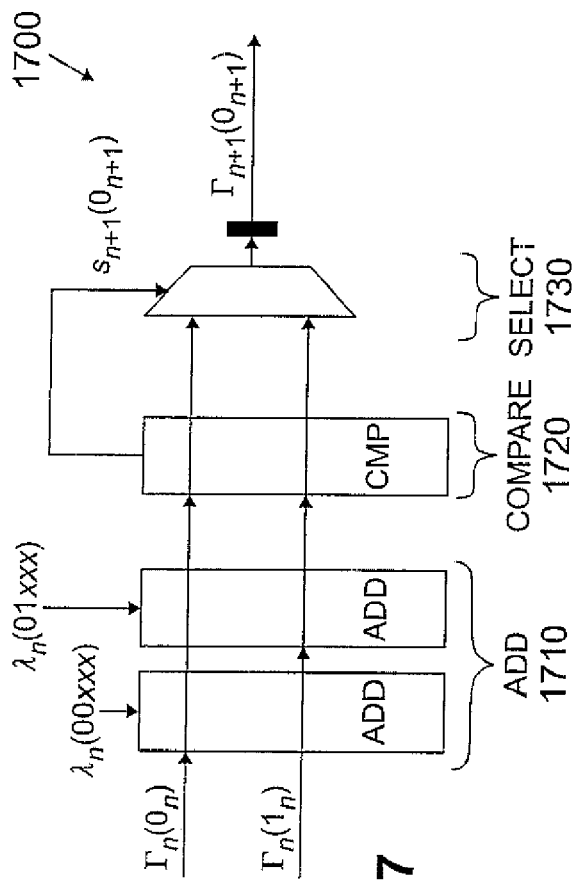
FIG. 17 is a functional block diagram of the ACS operation performed in FIGS. 8, 10, 11, 13, 15 and 16.

FIG. 17 is a functional block diagram 1700 of the ACS operation performed in FIGS. 8, 10, 11, 13, 15, and 16. As shown in FIG. 17, the ACS block 1700 includes an add function 1710, compare function 1720 and select function 1730. The exemplary add function 1710 includes two adders. The exemplary compare function 1720 could be implemented using a subtractor, where the sign bit of the subtractor output controls the selector 1730. The select function 1730 comprises a multiplexer, controlled by the output of the compare function 1720. FIG. 17 shows an exemplary two-way ACS implementation for a trellis with two transitions per state A 4-way ACS structure for a trellis with four transitions per state is shown in United States Patent Application entitled "Method and Apparatus for Multiple Step Viterbi Detection with Local Feedback," filed simultaneously herewith, assigned to the assignee of the present invention and incorporated by reference herein.

Among other benefits, the present invention allows for a VLSI implementation of reduced-state Viterbi detectors with local feedback for data rates that are significantly increased relative to conventional designs. Even larger data rate increases can be achieved when two or more trellis steps are processed within once clock period using a multi-step trellis. To achieve this additional speed advantage, the invention disclosed here can be combined with the multi-step detection method disclosed in United States Patent Application entitled "Method and Apparatus for Multiple Step Viterbi Detection with Local Feedback," filed contemporaneously herewith and incorporated by reference herein. The invention uses an architecture that is very regular making it suitable for high-speed implementation. Viterbi detectors with local feedback can achieve better error rate performance than postprocessor-based structures in the magnetic recording application. Therefore, reduced-state Viterbi detection with local feedback is an attractive detector structure for future read channel chips. The use of reduced-state Viterbi detection with local feedback in the magnetic recording application is described in E. F. Haratsch, "Viterbi Detector Architectures for Magnetic Recording," 2003 International Symposium on VLSI Technology, Systems, and Applications, 243-46, Oct. 6-8, 2003. Post-processor based detector structures are discussed in Z. A. Keirn et al., "On the Use of Redundant Bits for Magnetic Recording: Single Parity Codes and Reed-Solomon ECC," IEEE Transactions on Magnetics, 225-30 (January 2004), and the references therein.

Trace-Back Survivor Memory

Another benefit of the invention is that ACS decisions can be used to select precomputed branch metrics, ISI-free signal estimates or ISI estimates as shown in FIGS. 12-16. When ACS decisions are used to select precomputed values, the SMU 1240 and 1440 can be implemented using a trace-back structure, as survivor symbols are not used for local feedback anymore. The details of a trace-back survivor memory architecture can be read, e.g. in R. Cypher and C. B. Shung, "Generalized Trace-Back Techniques for Survivor Memory Management in the Viterbi Algorithm," Journal of VLSI Signal Processing, 85-94 (1993), or in H.-L. Lou, "Implementing the Viterbi algorithm", IEEE Signal Processing Magazine, 42-52 (September 1995), or in O. J. Joeressen and H. Meyr, "Viterbi Decoding with Dual Timescale Traceback Processing," IEEE International Symposium on Personal, Indoor and Mobile Radio Communications, 213-217 (September 1995), each incorporated by reference herein.

In a register-exchange survivor memory implementation, survivor symbols for each state are stored and updated at each detection step. In a trace-back implementation, however, ACS decisions are stored as pointers in a memory, and the detected symbols are obtained by tracing back the pointers that correspond to a survivor path. As the trace-back architecture does not require the updating of all survivor symbols at each detection step, it is associated with less power consumption than the register-exchange architecture. However, the trace-back architecture is associated with larger detection latency and therefore not suitable for the reduced-state Viterbi detector shown in FIG. 6, where zero delay survivor symbols are required for the local feedback to compute ISI estimates and branch metrics. However, the disclosed architectures shown in FIGS. 12-16 use ACS decision to select precomputed branch metrics, ISI-free signal estimates or ISI estimates, therefore making it possible to implement the survivor memory SMU using a trace-back architecture. In this case, the trace-back SMU will be associated with significantly less power consumption than a corresponding register-exchange SMU implementation.

Magnetic Recording Read Channels

The techniques described herein can be employed, e.g., to detect data in the presence of intersymbol interference and noise in magnetic recording read channels. The disclosed reduced-state Viterbi detectors with local feedback improve the detection of read data bits compared to post-processor based structures. In particular, the invention can be used to implement a read channel that performs noise-predictive data detection and achieves the ever increasing high data rates that are required by evolving storage applications. For a discussion of noise-predictive detection in magnetic recording, see, e.g., R. D. Cideciyan et al., "Noise Predictive Maximum Likelihood Detection Combined With Parity-Based Post-Processing," IEEE Trans on Magnetics, 714-20 (March 2001), and E. F. Haratsch, "Viterbi Detector Architectures for Magnetic Recording," International Symposium on VLSI Technology, Systems, and Applications, 243-46 (October 2003).

Figure 18:
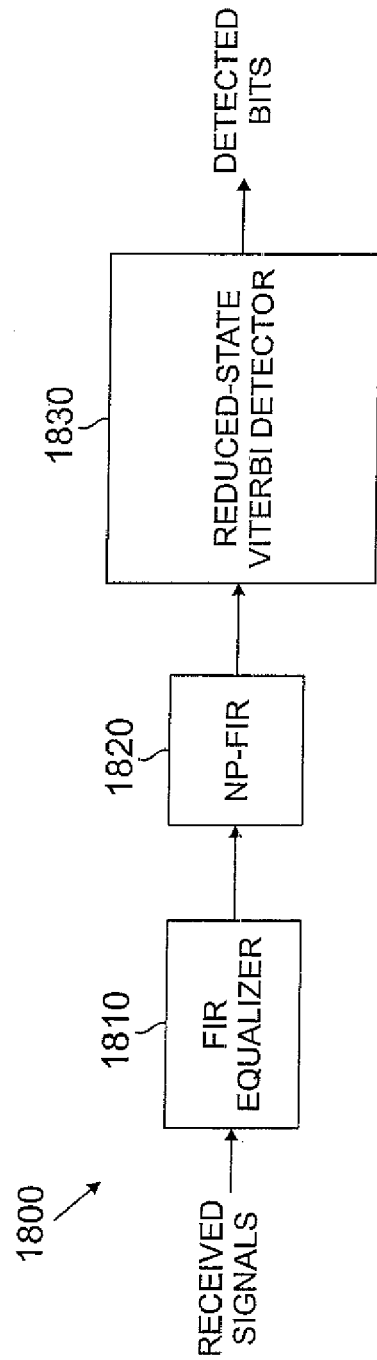
FIG. 18 is a functional block diagram of a read channel detector that implements noise-predictive data detection and uses one of the reduced-state Viterbi detectors of FIGS. 7-16 incorporating features of the invention.

The simplified block diagram for a read channel incorporating noise-predictive reduced-state Viterbi detection is shown in FIG. 18, where signals received at the input of the finite response (FIR) equalizer are in fact signals that have been processed by the analog front-end, which typically includes a variable gain amplifier; continuous time filter and A/D converter. The FIR equalizer 1810 shapes the channel impulse response such that the signals at the output of the FIR equalizer $y_n$ can be described by the equation:

$$y_n = \sum_{i=0}^{M} h_i \cdot a_{n-i} + v_n, \tag{20}$$

where $a_n$ are the data symbols defined as in equation (1), $h_i$ are the equalization target coefficients, M is the equalization target order, and $v_n$ is the noise at the output of the FIR equalizer. The equalization target is chosen such that its frequency spectrum matches the characteristics of the read channel well. The impulse response associated with the equalization target can be described by the equation:

$$H(D)=h_0+h_1 \cdot D+h_2 \cdot D^2+\ldots+h_M \cdot D^M. \tag{21}$$

The error rate performance of a lead channel can be improved by employing a noise-predictive FIR (NP-FIR) filter 1820 after the FIR equalizer 1810 that whitens the noise. The impulse response associated with the NP-FIR can be characterized with the polynomial:

$$P(D)=p_0+p_1 \cdot D+p_2 \cdot D^2+\ldots+p_N \cdot D^N, \tag{22}$$

where $p_i$, $0 \leq i \leq N$ are the coefficients and N is the order of the NP-FIR filter.

The subsequent reduced-state Viterbi detector considers a channel response with the polynomial:

$$F(D)=f_0+f_1 \cdot D+f_2 \cdot D^2+\ldots+f_{M+N} \cdot D^{M+N}=H(D) \cdot P(D), \tag{23}$$

and the signals at the input of the reduced-state Viterbi detector are given by:

$$r_n = \sum_{i=0}^{L} f_i \cdot a_{n-i} + w_n, \tag{24}$$

where $f_i$, $0 \leq i \leq L$, are the channel coefficients of the channel seen by the reduced-state Viterbi detector, L is the channel memory, and $w_n$ is the remaining noise at the output of the NP-FIR filter 1820. The channel memory L would be typically equal to L=M+N, but the reduced-state detector could also consider a channel with shorter channel memory, i.e. L<M+N. The channel coefficients $f_i$ are given by the convolution of the equalization target and the impulse response of the NP-FIR filter 1820 (see equation (23)). Equation (24) is equivalent to equation (2). Therefore, the features of the invention can be applied to the read channel application, i.e., a reduced-state can be defined as in equation (8), branch metrics can be precomputed as in equation (14) using the channel coefficients defined by (23), and an ACS operation can be performed as in equation (12). A correct branch metric for a transition in the trellis can be selected using the architectures shown in FIG. 8 or FIG. 13. Instead of branch metrics, ISI-free signal estimates or ISI estimates can be precomputed according to equations (15) and (17) respectively using the channel coefficients defined by (23), and a collect ISI-free signal estimate or ISI estimate can be selected as shown in FIGS. 10, 11, 15 and 16 respectively. Therefore, the reduced-state Viterbi detector 1830 can be implemented using the architectures shown in FIGS. 7-16.

The invention can also be applied when a parity check code is used to achieve coding gain. For example, when a one-bit parity check code is used, a state $\sigma_n$ in the full-state trellis is given by:

$$\sigma_n = (s_{n-1}; b_{n-1}, b_{n-2}, \ldots, b_{n-L}), \quad (25)$$

where $s_n$ is the running parity syndrome given by the XOR-sum:

$$s_n = b_n \oplus s_{n-1}. \quad (26)$$

The total number of states in the reduced-state trellis that accounts for the parity check code is given by:

$$2 \times 2^L \quad (27)$$

Analogous to equation (8), a state $\sigma_n$ in the reduced-state trellis can be defined by considering only the past K information bits or symbols:

$$\sigma_n = (s_{n-1}; b_{n-1}, b_{n-2}, \ldots, b_{n-K}), \quad (28)$$

and the number of states in the reduced-state trellis is equal to:

$$2 \times 2^K. \quad (29)$$

A conventional implementation of a reduced-state Viterbi detector that considers the reduced-state trellis defined according to equation (28) would use equations (10)-(12) to compute ISI estimates, blanch and path metrics. However, due to the local feedback required for the computation of ISI estimates, it is challenging to achieve very high data rates. However, the maximum achievable data rate can again be increased significantly by precomputing branch metrics and selecting correct ones as described above. Alternatively, ISI-free signal estimates or ISI estimates can be precomputed and correct ones can be selected as described above.

Branch metrics can be precomputed for possible bit sequences according to equation (14). As described above for L=4 and K=1, the required branch metric $\lambda_n$ ($b_n b_{n-1}$xxx) for a transition from state $\sigma_n = (s_{n-1}; b_{n-1})$ is selected among the precomputed branch metrics $\lambda_n$ ($b_n b_{n-1}$000), $\lambda_n$ ($b_n b_{n-1}$001), $\lambda_n$ ($b_n b_{n-1}$010), $\lambda_n$ ($b_n b_{n-1}$011), $\lambda_n$ ($b_n b_{n-1}$100), $\lambda_n$ ($b_n b_{n-1}$101), $\lambda_n$ ($b_n b_{n-1}$110), and $\lambda_n$ ($b_n b_{n-1}$111) based on survivor symbols or ACS decisions.

Figure 19:
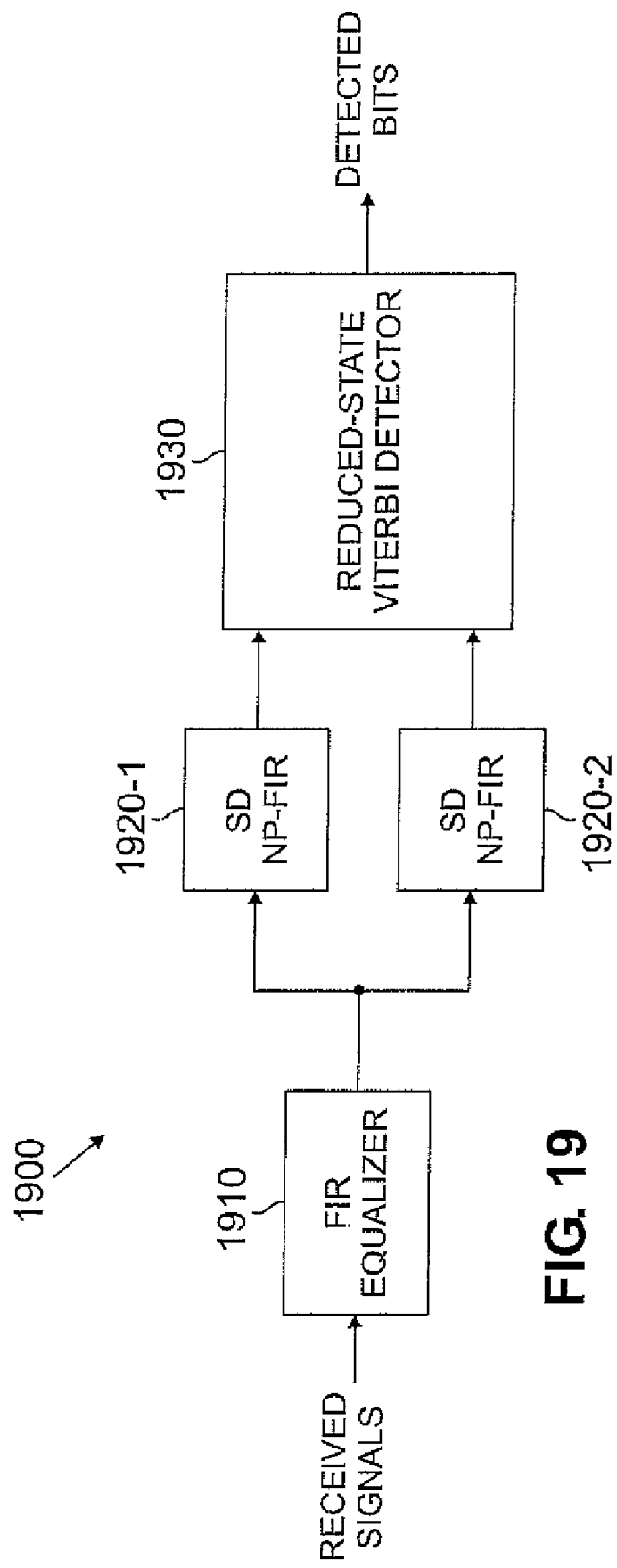
FIG. 19 is a functional block diagram of a read channel detector that implements signal-dependent noise-predictive data detection and uses one of the reduced-state Viterbi detectors of FIGS. 7-16 incorporating features of the invention.

The invention can also be applied to signal-dependent detection, which is sometimes referred to as data-dependent detection and explained in detail in the co-pending United States Patent Application entitled "Method and Apparatus for Generating Filter Tap Weights and Biases for Signal Dependent Branch Metric Computation," incorporated by reference herein. In signal-dependent detection, more than one signal-dependent (SD) NP-FIR filters operate in parallel to whiten the noise. FIG. 19 illustrates this for the case that two SD NP-FIR filters 1920-1 and 1920-2 are used. The invention can easily be used when there are more than two NP-FIR filters 1920. The reduced-state Viterbi detector 1930 can be implemented using the architectures shown in FIGS. 7-16.

In FIG. 19, the output of the FIR equalizer 1910 is supplied to two SD NP-FIR filters 1920-1 and 1920-2 to produced two signals $r_n(1)$ and $r_n(2)$. Each SD NP-FIR filter 1920 implements the impulse response defined by equation (22) with a different set of filter coefficients. For example, the first SD NP-FIR filter 1920-1 that produces $r_n(1)$ uses a first set of coefficients $p_i(1)$, $0 \leq i \leq N$, whereas the second SD NP-FIR filter 1920-2 that produces $r_n(2)$ uses a second set of coefficients $p_i(2)$, $0 \leq i \leq N$ that can differ from the first set of NP-FIR filter coefficients. The corresponding polynomials that describe the SD-NP FIR filters 1920 are denoted P(D;1) and P(D;2), e.g., $$P(D;1) = p_0(1) + p_1(1) \cdot D + p_N(1) \cdot D^N. \quad (30)$$

The filter coefficients of the different SD NP-FIR filters 1920 can differ; as in a signal-dependent channel the noise statistics depend on the transmitted data or bit sequence. The generation of filter coefficients for the SD NP-FIR filters is described in co-pending United States Patent Application entitled "Method and Apparatus for Generating Filter Tap Weights and Biases for Signal Dependent Branch Metric Computation," incorporated by reference herein.

For the considered channel with two SD NP-FIR filters 1920, the reduced-state Viterbi detector 1930 would compute branch metrics considering two different channel impulse responses with the polynomials F(D;1) and F(D;2) that are given by:

$$F(D;1) = f_0(1) + f_1(1) \cdot D + \ldots f_{M+N}(1) \cdot D^{M+N} = H(D) \cdot P(D;1), \text{ and} \quad (31)$$

$$F(D;2) = f_0(2) + f_1(2) \cdot D + \ldots f_{M+N}(2) \cdot D^{M+N} = H(D) \cdot P(D;2). \quad (32)$$

In a signal-dependent channel, the filter coefficients $f_i$ that are used to compute a branch metric depend on the transmitted data or bit sequence. For two SD NP-FIR filters 1920, branch metrics are precomputed according to equation (14) for a first group of bit sequences ($b_{n-1} b_{n-2} \ldots b_{n-L}$) using filter coefficients $f_i(1)$, and for a second group of bit sequences ($b_{n-1} b_{n-2} \ldots b_{n-L}$) the filter coefficients $f_i(2)$ are used.

For example, signal-dependent branch metrics for transitions from states $\sigma_n$ to $\sigma_{n+1}$ that correspond to all bit sequences starting with ($b_n b_{n-1}$)=(00) or ($b_n b_{n-1}$)=(11) are computed using channel coefficients $f_i(1)$ and the sample $r_n(1)$:

$$\lambda_n(00 b_{n-2} b_{n-3} \cdot b_{n-L}) = \left( r_n(1) - \sum_{i=0}^{L} f_i(1) \cdot a_{n-i} \right)^2, \quad (33)$$

$$\lambda_n(11 b_{n-2} b_{n-3} \cdot b_{n-L}) = \left( r_n(1) - \sum_{i=0}^{L} f_i(1) \cdot a_{n-i} \right)^2. \quad (34)$$

Continuing this example, signal-dependent branch metrics for all bit sequences that start with ($b_n b_{n-1}$)=(01) or ($b_n b_{n-1}$)=(10) are computed using the second of channel coefficients $f_i(2)$ and the second sample $r_n(2)$:

$$\lambda_n(01 b_{n-2} b_{n-3} \ldots b_{n-L}) = \left( r_n(2) - \sum_{i=0}^{L} f_i(2) \cdot a_{n-i} \right)^2, \quad (35)$$

$$\lambda_n(10 b_{n-2} b_{n-3} \ldots b_{n-L}) = \left( r_n(2) - \sum_{i=0}^{L} f_i(2) \cdot a_{n-i} \right)^2. \quad (36)$$

Comparing the signal-dependent branch metric equations (33)-(36) with the non signal-dependent branch metric equation (14), signal-dependent blanch metrics are computed using the same underlying function, but the choice of the sample $r_n$ and channel coefficients $f_i$ depends on the bit sequence for which the branch metric is computed. The precomputation of signal-dependent branch metrics was illustrated here using two signal-dependent NP-FIR filters and a particular grouping of bit sequences, but it is apparent how signal-dependent blanch metrics are precomputed for more than two signal-dependent NP-FIR filters and other groupings. E.g., all possible bit sequences of length L can be divided into more than two groups, for which separate samples $r_n$ and separate sets of channel coefficients $f_i$ would be used to precompute branch metrics.

The selection of the correct branch metric, the ACS operation and the SMU are implemented as described above for the non-signal dependent detector. Therefore all the benefits of the invention apply to signal-dependent detection as well. In a further variation of the present invention, signal-dependent ISI-free signal estimates or intersymbol interference estimates can be precomputed, instead of branch metric, as would be apparent to a person of ordinary skill in the art based on the present disclosure. Then, signal-dependent blanch metrics would be computed based on selected signal-dependent ISI-free signal estimates of ISI estimates as described above.

It is to be understood that the embodiments and variations shown and described herein are merely illustrative of the principles of this invention and that various modifications may be implemented by those skilled in the art without departing from the scope and spirit of the invention.

I claim:

1. A method for processing a received signal, said method comprising the steps of:
    processing said received signal using an FIR equalizer to generate an equalized received signal;
    processing said equalized received signal using a plurality of noise-predictive FIR filters to generate a plurality of signals;
    precomputing branch metrics for speculative sequences of one or more channel symbols, wherein at least one of said branch metrics is precomputed using an output of one of said plurality of noise-predictive FIR filters based on a bit pattern;
    storing said precomputed branch metrics in at least one pipeline register;
    selecting one of said precomputed branch metrics from one of said at least one pipeline register based on one or more of at least one survivor symbol and at least one ACS decision from at least one corresponding state; and
    selecting a path having a best path metric for a given state.

2. The method of claim 1, wherein said plurality of signals are noise whitened signals.

3. The method of claim 1, wherein said plurality of noise-predictive FIR filters each use a corresponding set of filter coefficients.

4. The method of claim 1, wherein a set of channel coefficients used to precompute at least one of said branch metrics is dependent on a bit pattern, and wherein said set of channel coefficients is given by a convolution of impulse responses of said FIR equalizer and one of said plurality of noise-predictive FIR filters.

5. The method of claim 1, wherein said processing of said received signal employs a trellis that includes syndrome information for a parity check code.

6. The method of claim 1, wherein said bit pattern is of length L, and all possible bit patterns of length L are divided in two or more subgroups, for which separate signals and separate sets of channel coefficients are used to precompute branch metrics.

7. A signal processor, comprising:
    an FIR equalizer to process a received signal to generate an equalized received signal;
    a plurality of noise-predictive FIR filters to process said equalized received signal to generate a plurality of signals;
    a branch metric unit for precomputing branch metrics for speculative sequences of one or more channel symbols, wherein at least one of said branch metrics is precomputed using an output of one of said plurality of noise-predictive FIR filters based on a bit pattern;
    at least one pipeline register for storing said precomputed branch metrics;
    at least one multiplexer for selecting one of said precomputed branch metrics from one of said at least one pipeline register based on one or more of at least one survivor symbol and at least one ACS decision from at least one corresponding state; and
    an add-compare-select unit for selecting a path having a best path metric for a given state.

8. The signal processor of claim 7, wherein said bit pattern is of length L, and all possible bit patterns of length L are divided in two or more subgroups, for which separate signals and separate sets of channel coefficients are used to precompute branch metrics.

9. A method for processing a received signal, said method comprising the steps of:
    precomputing intersymbol interference-free signal estimates for speculative sequences of one or more channel symbols;
    storing said precomputed intersymbol interference-free signal estimates in at least one pipeline register;
    selecting one of said precomputed intersymbol interference-free signal estimates from one of said at least one pipeline registers based on one or more of at least one survivor symbol and at least one ACS decision from at least one corresponding state; and
    selecting a path having a best path metric for a given state.

10. The method of claim 9, further comprising the steps of:
    processing said received signal using an FIR equalizer to generate an equalized received signal; and
    processing said equalized received signal using a noise-predictive FIR filter to generate a signal.

11. The method of claim 10, wherein said signal is a noise whitened signal.

12. The method of claim 10, wherein channel coefficients used to precompute said intersymbol interference-free signal estimates are a convolution of impulse responses of said FIR equalizer and said noise-predictive FIR filter.

13. The method of claim 9, further comprising the steps of:
    processing said received signal using an FIR equalizer to generate an equalized received signal; and
    processing said equalized received signal using a plurality of noise-predictive FIR filters to generate a plurality of signals.

14. The method of claim 13, wherein said plurality of noise-predictive FIR filters each use a corresponding set of filter coefficients.

15. The method of claim 13, wherein said step of precomputing intersymbol interference-free signal estimates precomputes at least one intersymbol interference-free signal estimates by using an output of one of said plurality of noise-predictive FIR filters based on a bit pattern.

16. The method of claim 15, wherein said bit pattern is of length L, and alt possible bit patterns of length L are divided in two or more subgroups, for which separate signals and separate sets of channel coefficients are used to precompute intersymbol interference-free signal estimates.

17. The method of claim 13, wherein a set of channel coefficients used to precompute at least one of said intersymbol interference-free signal estimates is dependent on a bit pattern, and wherein said set of channel coefficients is given by a convolution of impulse responses of said FIR equalizer and one of said plurality of noise-predictive FIR filters.

18. The method of claim 9, wherein said processing of said received signal employs a trellis that includes syndrome information for a parity check code.

19. A signal processor, comprising:
   an intersymbol interference unit for precomputing intersymbol interference-free signal estimates for speculative sequences of one or more channel symbols;
   at least one pipeline register for storing said precomputed intersymbol interference-free signal estimates;
   at least one multiplexer for selecting one of said precomputed intersymbol interference-free signal estimates from one of said at least one pipeline register based on one or more of at least one survivor symbol and at least one ACS decision from at least one corresponding state; and
   an add-compare-select unit for selecting a path having a best path metric for a given state.

20. The signal processor of claim 19, wherein said received signal is processed using an FIR equalizer to generate an equalized received signal and said equalized received signal is processed using a plurality of noise-predictive FIR filters to generate a plurality of signals, wherein at least one of said intersymbol interference-free signal estimates is precomputed using an output of one of said plurality of noise-predictive FIR filters based on a bit pattern and wherein said bit pattern is of length L, and all possible bit patterns of length L are divided in two or more subgroups, for which separate signals and separate sets of channel coefficients are used to precompute intersymbol interference-free signal estimates.

* * * * *

UNITED STATES PATENT AND TRADEMARK OFFICE
CERTIFICATE OF CORRECTION

| | | |
|---|---|---|
| PATENT NO. | : 7,702,991 B2 | |
| APPLICATION NO. | : 11/691847 | |
| DATED | : April 20, 2010 | |
| INVENTOR(S) | : Erich Franz Haratsch | |

It is certified that error appears in the above-identified patent and that said Letters Patent is hereby corrected as shown below:

In claim 16, column 21, line 2, "alt" should be replaced by -- all --.

Signed and Sealed this
Eighteenth Day of December, 2012

David J. Kappos
*Director of the United States Patent and Trademark Office*